United States Patent
Kim et al.

(10) Patent No.: US 11,133,249 B2
(45) Date of Patent: Sep. 28, 2021

(54) SEMICONDUCTOR DEVICE

(71) Applicant: SAMSUNG ELECTRONICS CO., LTD., Suwon-si (KR)

(72) Inventors: Yeonggil Kim, Hwaseong-si (KR); Jongmin Baek, Seoul (KR); Wookyung You, Hwaseong-si (KR); Kyuhee Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/877,088

(22) Filed: May 18, 2020

(65) Prior Publication Data
US 2021/0043561 A1 Feb. 11, 2021

(30) Foreign Application Priority Data
Aug. 7, 2019 (KR) .................. 10-2019-0096366

(51) Int. Cl.
*H01L 23/522* (2006.01)
*H01L 21/768* (2006.01)
*H01L 23/528* (2006.01)

(52) U.S. Cl.
CPC ...... *H01L 23/5226* (2013.01); *H01L 21/7685* (2013.01); *H01L 21/76829* (2013.01); *H01L 21/76877* (2013.01); *H01L 23/5283* (2013.01); *H01L 21/76807* (2013.01)

(58) Field of Classification Search
CPC ... H01L 23/522; H01L 23/528; H01L 23/532; H01L 23/5226; H01L 23/5283; H01L 23/53295; H01L 21/768; H01L 21/76807; H01L 21/7685; H01L 21/76829; H01L 21/76877; H01L 21/76831; H01L 21/76808; H01L 21/76895
USPC ....................................................... 257/750
See application file for complete search history.

(56) References Cited

U.S. PATENT DOCUMENTS 5,818,071 A * 10/1998 Loboda ............... H01L 23/5329
5,924,004 A *  7/1999 Hsu ................... H01L 21/76808
                                                          438/622
6,191,031 B1   2/2001 Tajuchi et al.
(Continued)

FOREIGN PATENT DOCUMENTS

KR  10-2003-0058299  12/2001
KR  10-2005-0086301   2/2004

*Primary Examiner* — Chuong A Luu
(74) *Attorney, Agent, or Firm* — F. Chau & Associates, LLC

(57) ABSTRACT

A semiconductor device includes a contact structure connected to an active region. A first insulating layer is disposed on a barrier dielectric layer and has a first hole connected to the contact structure. A second insulating layer is disposed on the first insulating layer and has a trench connected to the first hole. The second insulating layer has an extended portion along a side wall of the first hole. A width of the first hole less the space occupied by the extended portion is defined as a second hole. A wiring structure including a conductive material is connected to the contact structure. A conductive barrier is disposed between the conductive material and the first and second insulating layers. An etch stop layer is disposed between the first and second insulating layers and between the extended portion of the second insulating layer and a side wall of the first hole.

20 Claims, 25 Drawing Sheets

(56) References Cited

U.S. PATENT DOCUMENTS

| | | | |
|---|---|---|---|
| 6,436,824 B1* | 8/2002 | Chooi | H01L 21/3125 |
| | | | 438/687 |
| 6,972,253 B2 | 12/2005 | Liu et al. | |
| 8,592,990 B2 | 11/2013 | Chikaki et al. | |
| 2008/0036092 A1 | 2/2008 | Gambino | |
| 2013/0334700 A1 | 12/2013 | Singh et al. | |
| 2017/0194242 A1 | 7/2017 | Huang et al. | |
| 2018/0012796 A1 | 1/2018 | Lee et al. | |
| 2020/0066581 A1* | 2/2020 | Tung | H01L 21/7684 |

\* cited by examiner

SEMICONDUCTOR DEVICE

CROSS-REFERENCE TO RELATED APPLICATION

This application claims benefit of priority under 35 U.S.C. § 119 to Korean Patent Application No. 10-2019-0096366 filed on Aug. 7, 2019 in the Korean Intellectual Property Office, the disclosure of which is incorporated by reference herein in its entirety.

1. TECHNICAL FIELD

The present disclosure relates to a semiconductor device.

2. DISCUSSION OF RELATED ART

In various semiconductor devices an interconnect structure between various conductive elements may be used. The various conductive elements may be located on different levels in a vertical direction. The interconnect structure may include a contact plug connected to an active region, such as a source and a drain, or a conductive line of a Back End Of Line (BEOL).

In recent years, the integration of a semiconductor device has increased. Due to the introduction of the interconnect structure, complications may arise, such as undesired short circuits between adjacent components and/or an insufficiently secured interconnect connection area (or a contact area).

For example, during a process in which a metal interconnect of a Back End of Line (BEOL) is formed, and as a metal pitch is reduced, a chamfer of a portion of an insulating layer located between metal vias may be collapsed during a Dual Damascene process. Thus, short circuits with a contact structure located below the portion of the insulating layer or degradation of time-dependent dielectric breakdown (TDDB) may occur.

On the other hand, when a single damascene process is used on a first insulating layer, a metal via should be covered. In addition to an etch stop layer, an insulating barrier film (for example, a hermetic barrier) is introduced. Thus, an etch stop structure may become complicated, and the RC performance may be degraded due to a remaining insulating barrier film.

SUMMARY

According to an exemplary embodiment of the present inventive concept, a semiconductor device includes a contact structure connected to an active region. A first insulating layer is disposed on a barrier dielectric layer and has a first hole connected to the contact structure. A second insulating layer is disposed on the first insulating layer and has a trench connected to the first hole. The second insulating layer has an extended portion along a side wall of the first hole. A width of the first hole less the space occupied by the extended portion is defined as a second hole. A wiring structure including a conductive material is connected to the contact structure. A conductive barrier is disposed between the conductive material and the first and second insulating layers. An etch stop layer is disposed between the first and second insulating layers and between the extended portion of the second insulating layer and a side wall of the first hole.

According to an exemplary embodiment of the present inventive concept, a semiconductor device is provided including a substrate having a conductive element and an interlayer insulating layer surrounding the conductive element. A first etch stop layer and an insulating barrier film are sequentially disposed on the interlayer insulating layer. A first insulating layer disposed on the interlayer insulating layer. The first insulating layer has a hole connected to the conductive element. A second insulating layer is disposed on the first insulating layer, the second insulating layer has a trench connected to the hole. The trench extends in a first direction and has an extended portion along an inner side wall of the hole in a cross-section taken along a second direction intersecting the first direction. A wiring structure has a conductive via connected to the conductive element through the hole. A wiring line fills the trench and is connected to the conductive via. A conductive barrier is disposed between the conductive via and the wiring line and the first and second insulating layers. A second etch stop layer is disposed between the first and second insulating layers and extends between the extended portion and an inner side wall of the hole. The second etch stop layer is not provided at an interface between the wiring structure and the first and second insulating layers.

According to an exemplary embodiment of the present inventive concept, a semiconductor device is provided including a substrate having a conductive element, and an interlayer insulating layer surrounding the conductive element. A first etch stop layer and an insulating barrier film are sequentially disposed on the interlayer insulating layer. A first insulating layer is disposed on the interlayer insulating layer. The first insulating layer has a hole connected to the conductive element. A second insulating layer is disposed on the first insulating layer. The second insulating layer has a trench connected to the hole and extends in a first direction. A wiring structure has a conductive via connected to the conductive element through the hole. A wiring line fills the trench and is connected to the conductive via. A conductive barrier is disposed between the conductive via and the wiring line and the first and second insulating layers. A second etch stop layer is disposed between the first and second insulating layers and is in direct contact with the first and second insulating layers, and is not provided at an interface between the wiring structure and the first and second insulating layers.

According to an exemplary embodiment of the present inventive concept, a semiconductor device is provided including a wiring structure connected to a contact structure. The wiring structure includes a metal line and a conductive via. The metal line is disposed in a first insulating layer. The metal line extends in a first direction. The conductive via is disposed in a second insulating layer. The conductive via extends in a thickness direction through the second insulating layer. An etch stop layer is disposed between the first insulating layer and the second insulating layer. A width of the conductive via in the first direction is greater than a width of the conductive via in a second direction perpendicular to the first direction. Sidewalls of the conductive via spaced in the second direction are surrounded by extending portions of the first insulating layer and the etch stop layer, the extending portions of the first insulating layer and the etch stop layer extend in an oblique direction to the thickness direction. Sidewalls of the conductive via spaced in the first direction are not covered by the extending portions of the first insulating layer and the etch stop layer.

BRIEF DESCRIPTION OF DRAWINGS

The above and other aspects of the present disclosure will be more clearly understood from the following detailed description, taken in conjunction with the accompanying drawings, in which.

DETAILED DESCRIPTION OF THE EMBODIMENTS

Hereinafter, exemplary embodiments of the present inventive concept will be described in detail with reference to the attached drawings.

Figure 1:
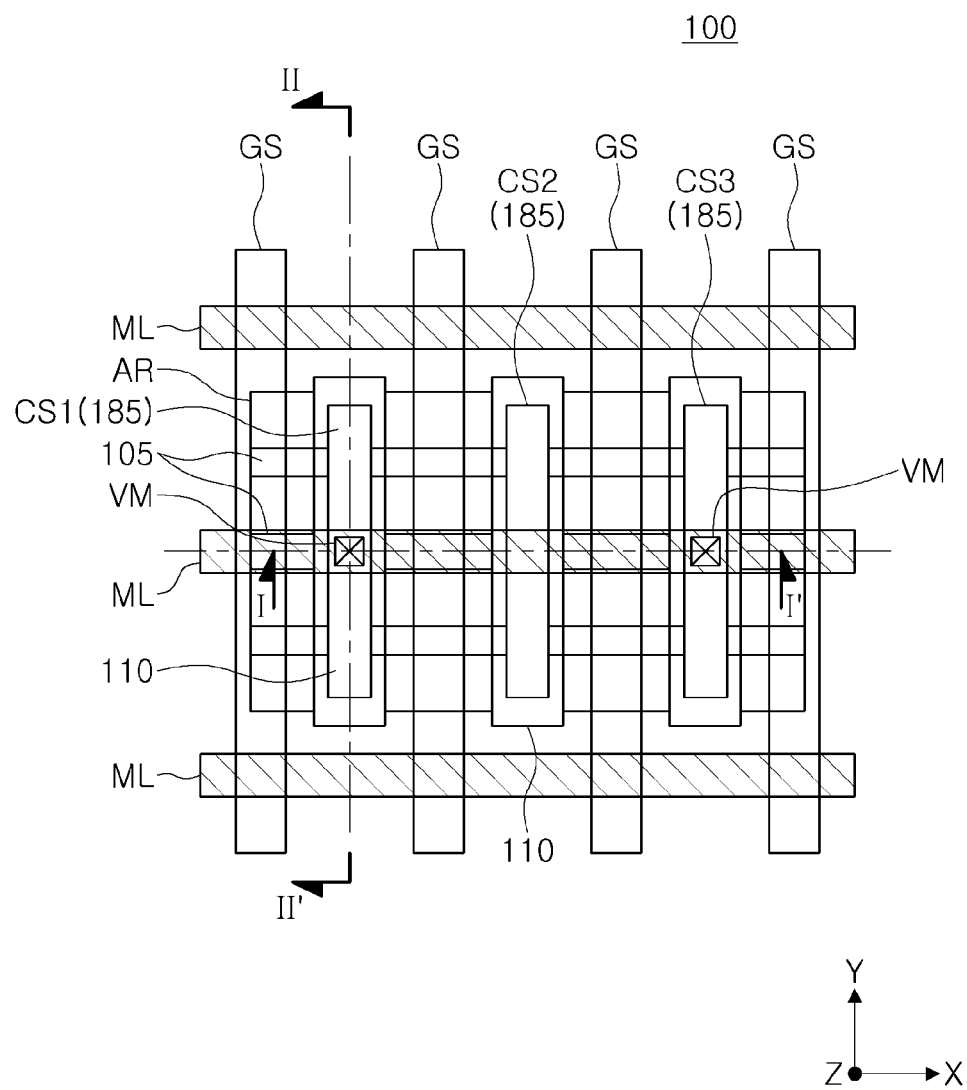
FIG. 1 is a plan view illustrating a main component of a semiconductor device according to an exemplary embodiment of the present inventive concept.
Figure 2:
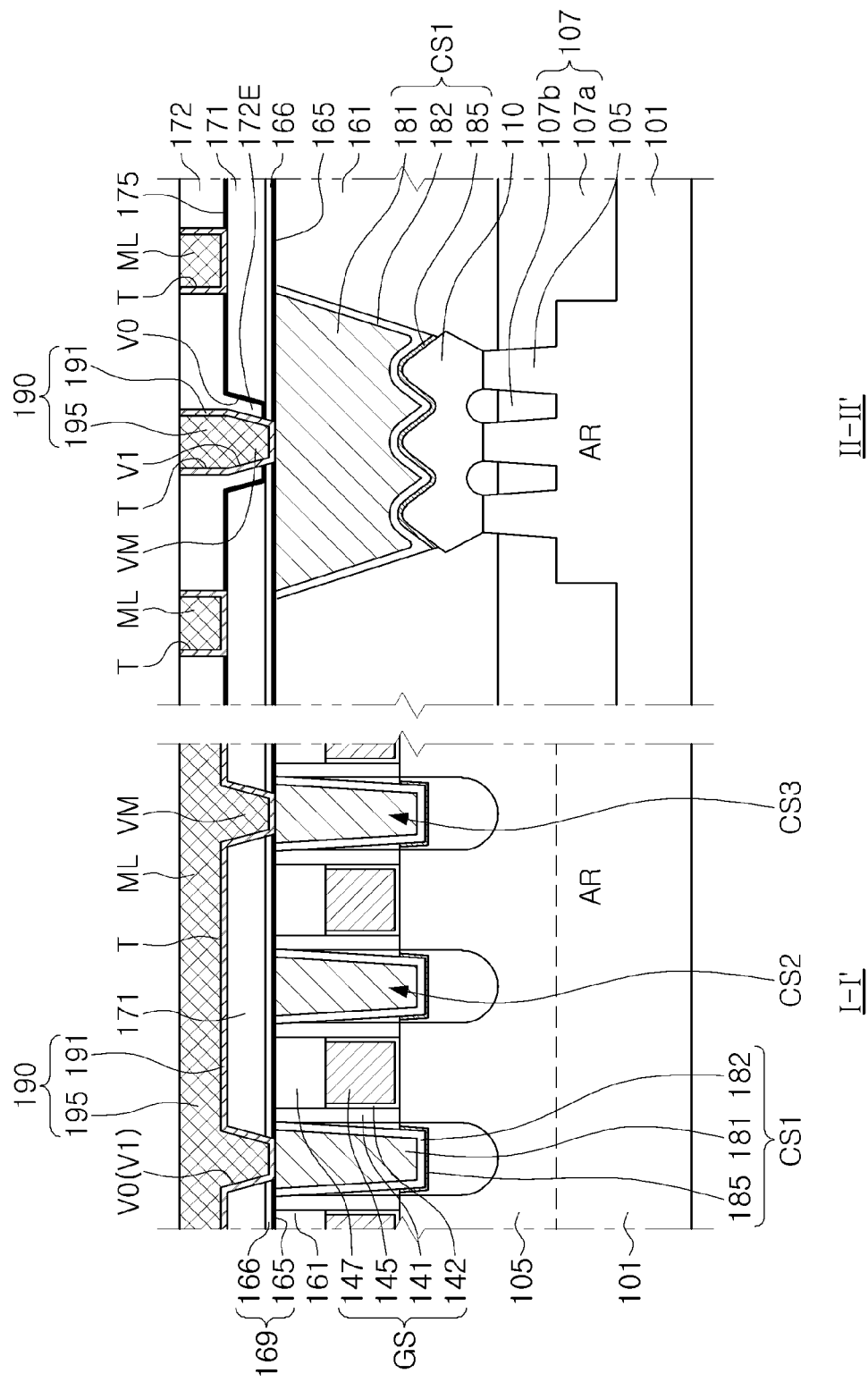
FIG. 2 is cross-sectional views illustrating the semiconductor device of FIG. 1 taken along line I-I' and line II-II'.

FIG. 1 is a plan view illustrating a main component of a semiconductor device according to an exemplary embodiment of the present inventive concept, and FIG. 2 is cross-sectional views of the semiconductor device of FIG. 1 taken along line I-I' and line II-II'.

Referring to FIGS. 1 and 2, a semiconductor device 100 according to an exemplary embodiment of the present inventive concept includes an active region AR and a device isolation region 107, disposed on a substrate 101.

In an exemplary embodiment of the present inventive concept, the substrate 101 may include a semiconductor such as Si or Ge, or a compound semiconductor such as SiGe, SiC, GaAs, InAs, or InP. In an exemplary embodiment of the present inventive concept, the substrate 101 may have a silicon on insulator (SOI) structure. The active region AR may be a conductive region such as a well doped with impurities or a structure doped with impurities. For example, the active region AR may be an n-type well for a PMOS transistor or a p-type well for an NMOS transistor.

An active fin 105 may be disposed on an upper surface of the active region AR. Each active fin 105 may have a structure protruding upwardly in a third direction (e.g., a Z direction) from the upper surface of the active region AR. In an exemplary embodiment of the present inventive concept, three active fins 105 are provided, by way of example, but the present inventive concept is not limited thereto. Alternatively, a single active fin or a plurality of active fins other than the three active fins may be provided.

As illustrated in FIG. 1, the active fins 105 may extend from the active region AR in the first direction (e.g., an X direction). The active fins 105 may be spaced in parallel in a second direction (e.g., a Y direction). The active fin 105 may be provided as an active region of a transistor.

The device isolation region 107 may define an active region AR. For example, the active region AR may have a complementary shape to the device isolation region 107. The device isolation region 107 may include a silicon oxide or silicon oxide-based insulating material. The device isolation region 107 may include a first isolation region 107a defining the active region AR, and a second isolation region 107b defining the active fin 105. The first isolation region 107a may have a bottom surface deeper than the second isolation region 107b. For example the second isolation region 107b may have a lower surface that directly contacts the active region AR that is disposed on the substrate 101, whereas the first isolation region 107a may have a lower surface disposed directly on the substrate 101.

For example, the first isolation region 107a may be referred to as a deep trench isolation (DTI), while the second isolation region 107b may be referred to as a shallow trench isolation (STI). The second isolation region 107b may be disposed on the active region AR. As described above, the active fin 105 passes through the second isolation region 107b, and a portion of the active fin 105 may protrude above an upper portion of the second isolation region 107b.

The semiconductor device 100 according to an exemplary embodiment of the present inventive concept may include a gate structure GS. As illustrated in FIG. 1, the gate structure GS may have a closed-line shape in a plan view which extends in the second direction (e.g., the Y direction) intersecting the first direction (e.g., the X direction). The gate structure GS may overlap a region of the active fin 105.

The gate structure GS may include gate spacers 141, a gate dielectric film 142 and a gate electrode 145 sequentially disposed between the gate spacers 141, and a gate capping layer 147 disposed on the gate electrode 145.

The semiconductor device 100 according to an exemplary embodiment of the present inventive concept may include a source/drain region 110 and first to third contact structures CS1, CS2, and CS3, connected to the source/drain region 110. The source/drain region 110 may be formed on the active fin 105 located at both sides of the gate structure GS.

In an exemplary embodiment of the present inventive concept, the source/drain region 110 may be formed by forming a recess in some regions of the active fin 105, and selective epitaxial growth (SEG) of the recess. The source/drain region 110 may include Si, SiGe, and/or Ge, and the source/drain region 110 may have a different material and/or a different shape according to an N-type or P-type transistor. For example, in the case of a PMOS transistor, the source/drain region 110 may include silicon-germanium (SiGe), and may be doped with P-type impurities (for example, boron (B), indium (In), or gallium (Ga)). A cross section of the source/drain region 110 may have a pentagonal shape. In the case of an NMOS transistor, the source/drain region 110 may include silicon, and may be doped with N-type impurities (for example, phosphorus (P), nitrogen (N), arsenic (As), or antimony (Sb)). A cross section of the source/drain region 110 may have a hexagonal shape or a polygonal shape.

As described above, a Fin-FET may include a gate structure GS and the source/drain region 110 together with an active fin 105, on the active region AR.

In the semiconductor device 100 according to an exemplary embodiment of the present inventive concept, an interlayer insulating layer 161 may be disposed on the device isolation region 107. The interlayer insulating layer 161 may be disposed around the gate structure GS. For example, the interlayer insulating layer 161 may include tetraethyl orthosilicate (TEOS), undoped silica glass (USG), phosphor silicate glass (PSG), boron-silicate glass (BSG), boron phosphate silicate glass (BPSG), fluorinated silica glass (FSG), silicon on glass (SOG), and/or tonen silazene TOSZ. The interlayer insulating layer 161 may be formed using a chemical vapor deposition (CVD) or spin coating process.

According to an exemplary embodiment of the present inventive concept first to third contact structures CS1, CS2, and CS3 are formed to pass through at least a portion of the interlayer insulating layer 161, and each of the first to third contact structures CS1, CS2, and CS3 may be connected to the source/drain region 110.

As illustrated in FIG. 2, each of the first to third contact structures CS1, CS2, and CS3 may include a metal silicide layer 182, a conductive barrier 181, and a contact plug 185. The conductive barrier 181 may cover a side surface and a lower surface of the contact plug 185. The metal silicide layer 182 may be disposed between the conductive barrier 181 and the source/drain regions 110.

For example, the conductive barrier 181 may include Ta, TaN, Mn, MnN, WN, Ti, or TiN. The metal silicide layer 182 may include CoSi, NiSi, or TiSi. The contact plug 185 may include tungsten (W), cobalt (Co), titanium (Ti), alloys thereof or a combination thereof.

The semiconductor device 100 according to an exemplary embodiment of the present inventive concept may include a wiring structure 190, such as a Back End Of Line (BEOL), connected to each of the first to third contact structures CS1, CS2, and CS3. The wiring structure 190 (or a trench T) according to an exemplary embodiment of the present inventive concept may extend in the first direction (e.g., the X direction). As illustrated in FIG. 1, a plurality of wiring lines ML included in the wiring structure 190 may be arranged in a second direction (e.g., the Y direction) intersecting the first direction (e.g., the X direction).

A barrier dielectric layer 169 is disposed on the interlayer insulating layer 161. The barrier dielectric layer 169 may at least partially surround the first to third contact structures CS1, CS2, and CS3. The barrier dielectric layer 169 may be composed of a plurality of layers. The barrier dielectric layer 169 may include a first etch stop layer 165 disposed on the interlayer insulating layer 161, and an insulating barrier film 166 disposed on the first etch stop layer 165.

As described above, the first to third contact structures CS1, CS2, and CS3 include a metal component, and thus a barrier structure may be included together with an etch stop element. For example, the first etch stop layer 165 may include silicon nitride, silicon carbonitride, aluminum nitride, and/or aluminum oxide. For example, the insulating barrier film 166 may include silicon oxide, silicon nitride, and/or silicon oxynitride.

The first insulating layer 171 and the second insulating layer 172 are sequentially disposed in the insulating barrier film 166. The first and second insulating layers 171 and 172 may include a material having a low dielectric constant. For example, the first and second insulating layers 171 and 172 may include a silicon oxycarbide (SiOC) film, and/or a carbon-doped silicon oxide (SiCOH) film. The first and second insulating layers 171 and 172 may be formed using different processes. For example, the first insulating layer 171 may be formed using a deposition process such as CVD, while the second insulating layer 172 may be formed using a spin coating or flowable-CVD process with excellent gap-fill characteristics.

The second insulating layer 172 may include a composition different from a composition of the first insulating layer 171. For example, even when the first insulating layer 171 and the second insulating layer 172 include the same component, the composition ratios may be different from each other. For example, the first insulating layer 171 and the second insulating layer 172 include SiCOH, and are formed using different processes as described above, so composition ratios thereof may be different from each other.

The first insulating layer 171 may have first holes V0 connected to each of the first and third contact structures CS1 and CS3. The second insulating layer 172, disposed on the first insulating layer 171, may have a trench T connected to each first hole V0. The trench T may extend in the first direction (e.g., the X direction). The second insulating layer 172 may have an extended portion 172E along an inner side wall of the first hole V0. The extended portion 172E may be arranged in the first hole V0 covering side surfaces of the second hole V1. A contact area of the first and third contact structures CS1 and CS3 may be defined by the second hole V1 having a width reduced as compared with a width of the first hole V0.

In an exemplary embodiment of the present inventive concept, referring to a cross-section taken along line I-I' of FIG. 2 (hereinafter, referred to as "I-I' cross section"), a width of a metal via VM in the first direction (e.g., the X direction) is defined by a width of the first hole V0. Referring to a cross-section taken along line II-II' of FIG. 2 (hereinafter, referred to as "II-II' cross section"), a width of a metal via VM in the second direction (e.g., the Y direction) is defined by a width of the second hole V1 formed to accommodate extended portions 172E of the second insulating layer 172.

The second hole V1 may have a width in the second direction (e.g., the Y direction), smaller than a width in the first direction (e.g., the X direction). The width of the second hole V1 in the second direction (e.g., the Y direction) may be determined by a width of the trench T. For example, the maximum width of the second hole V1 may correspond to a width of the wiring line ML. The width of the wiring line ML could be set to be smaller than a width of the first hole V0, so the wiring structure 190 may secure a sufficient distance with another wiring structure adjacent thereto in the second direction (e.g., the Y direction).

The wiring structure 190 has a conductive material 195 filling the second hole V1 and the trench T, and a conductive barrier 191 disposed between the conductive material 195 and the first and second insulating layers 171 and 172. The conductive material 195 may be divided into a conductive via VM connected to the first and third contact structures CS1 and CS3 through the second hole V1, and a wiring line ML filling the trench T and connected to the conductive via VM. The conductive material 195 included in the conductive via VM and the wiring line ML, may include Cu, Co, Mo, Ru, and/or W. The conductive barrier 191 may include Ta, TaN, Mn, MnN, WN, Ti, and/or TiN.

A second etch stop layer 175 may be disposed between the first and second insulating layers 171 and 172. In the II-II' cross section of FIG. 2, the second etch stop layer 175 is extended and remains between the extended portion 172E of the second insulating layer 172 and an inner side wall of the first hole V0 and on a portion of an insulating barrier film 166 located on a bottom surface of the first hole V0. On the other hand, the second etch stop layer 175 might not be provided in a region in which the wiring structure 190 is located. For example, the second etch stop layer 175 might not be provided at an interface between the wiring structure 190 and the first insulating layer 171 and/or at an interface between the wiring structure 190 and the second insulating layer 172.

Thus, as illustrated in FIG. 2, the conductive barrier 191 of the wiring structure 190 may be in direct contact with a surface of the first and second insulating layers 171 and 172. For example, the second etch stop layer 175 may include silicon nitride, silicon carbonitride, aluminum nitride, and/or aluminum oxide. The second etch stop layer 175 may include a material the same as that of the first etch stop layer 171.

The conductive via VM and the wiring line ML may have an integrated structure in a similar manner to a dual damascene process (see FIG. 9). However, in a manner different from a dual damascene process, the second etch stop layer 175 may be introduced, thus an inner side wall of the first insulating layer 171 may be maintained substantially vertically while a portion of the first insulating layer 171, located between adjacent conductive vias VM, is not chamfered. The second insulating layer 172 is formed in the first hole V0 and then the second hole V1 is formed. Thus, a contact area of a final conductive via VM may be defined in a formation process of the second hole V1.

In this process, an extended portion 172E of the second insulating layer 172 may be disposed in an inner side wall of the first hole V0. In a subsequent process, the second etch stop layer 175 is removed from a region in which the wiring structure 190 is to be located, so deterioration of RC performance, caused by the second etch stop layer 175, a high dielectric substance, may be reduced. Moreover, a complex etch stop structure used between the first and second insulating layers 171 and 172 in a dual damascene process may be simplified. For example, in an exemplary embodiment of the present inventive concept, the insulating barrier film 166 may be omitted, and the second etch stop layer 175 only may be used.

The wiring structure 190, described above, may be usefully applied to other types of semiconductor devices. For example, as a semiconductor device according to an exemplary embodiment of the present inventive concept, a fin-type transistor (FinFET) including a fin-type channel region as illustrated in FIG. 2 is described, but the present inventive is not limited thereto. The semiconductor device according to an exemplary embodiment of the present inventive concept may include a tunneling field effect transistor (tunneling FET), a transistor including a nano wire, a transistor including a nano sheet, for example, a Multi Bridge Channel FET (MBCFET®)), or various three-dimensional (3D) transistors.

Figure 3:
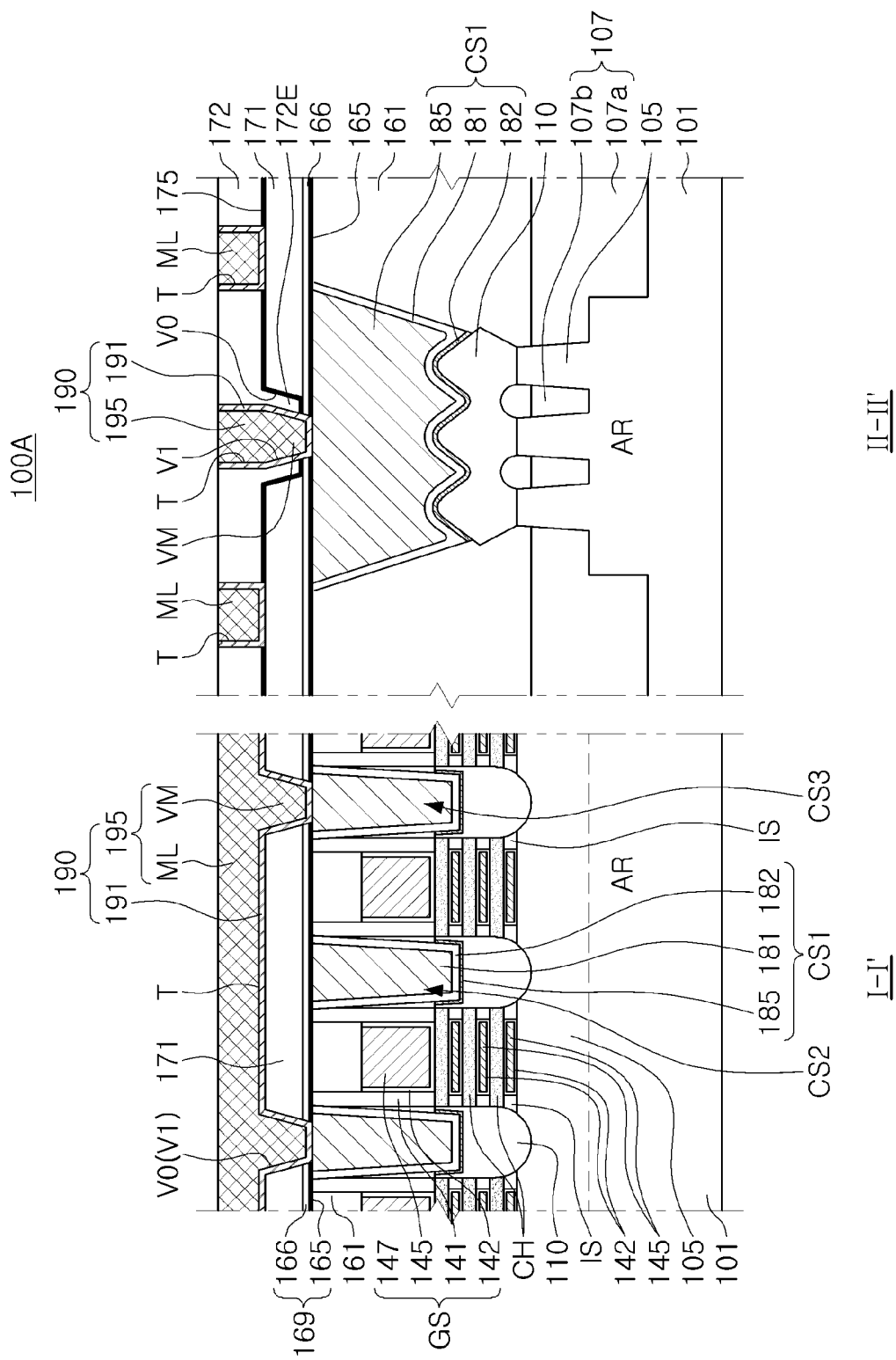
FIG. 3 is cross-sectional views illustrating a semiconductor device according to an exemplary embodiment of the present inventive concept.

FIG. 3 is cross-sectional views of a transistor including a nano sheet (for example, MBCFET®), as a semiconductor device according to an exemplary embodiment of the present inventive concept.

Referring to FIG. 3, a semiconductor device 100A may be similar to the exemplary embodiment of the present inventive concept illustrated in FIGS. 1 and 2 except that a structure corresponding to an active fin is implemented as a multi-channel structure using a nano sheet. Moreover, like reference numerals illustrated in FIGS. 1 and 2 may refer to like elements.

As illustrated in FIG. 3, a plurality of channel layers CH having a nano sheet structure are spaced apart from each other in a third direction (e.g., the Z direction) perpendicular to an upper surface of the substrate 101 on the active region AR. A gate electrode 145 may extend in a second direction (e.g., the Y direction) intersecting the first direction (e.g., the X direction) and surround the plurality of channel layers CH. As described above, the gate electrode 145 may be interposed between gate spacers 141 and also between a plurality of channel layers CH.

The semiconductor device 100A may include a source/drain region 110 disposed in the active region AR located at both sides of the gate electrode 145 and connected to the plurality of channel layers CH. In an exemplary embodiment of the present invention, the source/drain region 110 is disposed in the active region AR located at both sides of the gate electrode 145, and may be connected to the plurality of channel layers CH. Although three channel layers CH are illustrated in FIG. 3, by way of example, the number of channel layers is not particularly limited. The channel layers CH may be formed of semiconductor patterns. For example, the semiconductor patterns may include silicon (Si), silicon Germanium (SiGe), and/or germanium (Ge).

The source/drain region 110 may include an epitaxial layer formed using the plurality of channel layers CH and the active region AR as a seed. The source/drain region 110 may include silicon germanium (SiGe), silicon (Si), and/or silicon carbide (SiC).

Internal spacers IS provided between each source/drain region 110 and the gate electrode 145 may be included. The internal spacers IS may be provided at sides of the gate electrode 145. The internal spacers IS and the channel layers CH may be alternately located in the Z direction (e.g., the Z direction) perpendicular to the upper surface of the substrate 101. Each of the source/drain regions 110 may be in contact with the channel layer CH, and may be spaced apart from the gate electrode 145 with the internal spacers IS interposed therebetween. The gate dielectric film 142 is interposed as a horizontal segment extending in the first direction (e.g., the X direction) between the gate electrode 145 and each of the channel layers CH. The gate dielectric film 142 may include a vertical segment between the gate electrode 145 and each of the internal spacers IS that extends in the third direction (e.g., the Z direction) and connects to the horizontal segment of the dielectric film 142.

In a similar manner to the previously described exemplary embodiment of the present inventive concept, the first insulating layer 171 has first holes V0 connected to each of the first and third contact structures CS1 and CS3, while the second insulating layer 172, disposed on the first insulating layer 171, has a trench T connected to each of the first hole V0. The trench T may extend in the first direction (e.g., the X direction). The second insulating layer 172 may have an extended portion 172E along an inner side wall of the first hole V0, and the extended portion 172E may extend obliquely in relation to the third direction (e.g., the Z direction) and the first direction (e.g., the X direction) and the second hole V1 may be formed between extended portions 172E. A contact area of the first and third contact structures CS1 and CS3 may be defined by the second hole V1 having a width reduced as compared with a width of the first hole V0.

As described above, the second hole V1 may have a width in the second direction (e.g., the Y direction) smaller than a width of the second contact hole V1 in the first direction (e.g., the X direction). The maximum width of the second hole V1 in the second direction (e.g., the Y direction) may be determined by a width of the trench T, (e.g., the wiring line ML). The width of the wiring line ML could be set to be smaller than a width of the first hole V0, so the wiring structure 190 may secure a sufficient distance with another wiring structure 190 adjacent thereto in the second direction (e.g., the Y direction).

Hereinafter, in a method of manufacturing a semiconductor device according to an exemplary embodiment of the present inventive concept, a wiring structure manufacturing process will be mainly described in detail with reference to FIGS. 4 to 9. Like reference numerals may refer to like elements previously introduced.

FIGS. 4A, 5A, 6A, 7A, 8A and 9A are plan views illustrating steps in a method of manufacturing a semiconductor device according to an exemplary embodiment of the present inventive concept. FIGS. 4B, 5B, 6B, 7B, 8B and 9B are cross-sectional views of steps in a method of manufacturing the semiconductor device of FIGS. 4A, 5A, 6A, 7A, 8A and 9A, respectively, taken along line X-X'. FIGS. 4C, 5C, 6C, 7C, 8C and 9C are cross-sectional views illustrating steps in a method of manufacturing the semiconductor device of FIGS. 4A, 5A, 6A, 7A, 8A and 9A, respectively, taken along line Y-Y'.

Figure 4A:
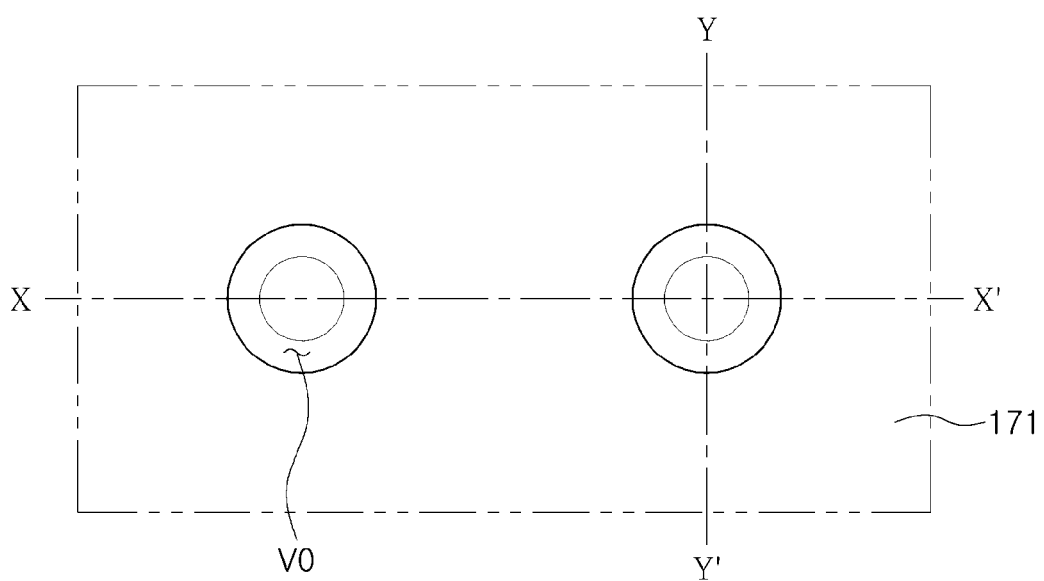
FIGS. 4A, 5A, 6A, 7A, 8A, 9A are plan views illustrating steps in a method of manufacturing a semiconductor device according to an exemplary embodiment of the present inventive concept.
Figure 4B:
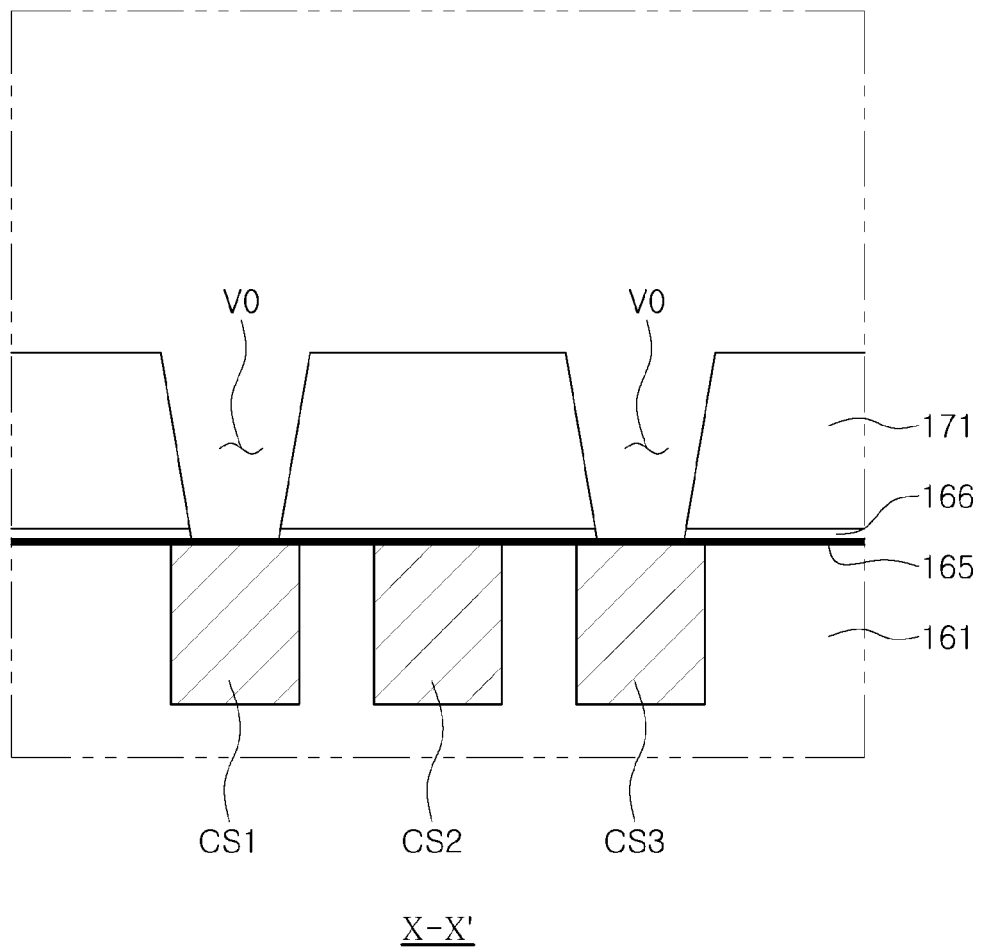
FIGS. 4B, 5B, 6B, 7B, 8B, and 9B are cross-sectional views illustrating the steps in a method of manufacturing a semiconductor device of FIGS. 4A, 5A, 6A, 7A, 8A, 9A, respectively, taken along line X-X'.
Figure 4C:
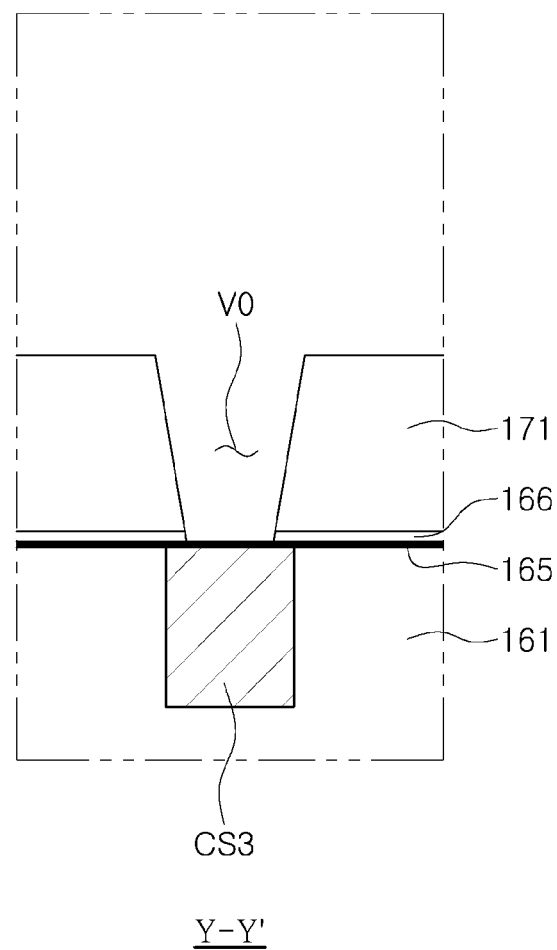
FIGS. 4C, 5C, 6C, 7C, 8C and 9C are cross-sectional views illustrating steps in a method of manufacturing the semiconductor device of FIGS. 4A, 5A, 6A, 7A, 8A, 9A A, respectively, taken along line Y-Y.

Referring to FIGS. 4A to 4C, a first insulating layer 171 is disposed on an interlayer insulating layer 161. The interlayer insulating layer 161 surrounds the first to third contact structures CS1, CS2, and CS3, and first holes V0 connected to each of the first and third contact structures CS1 and CS3 may be formed in the first insulating layer 171. The first holes V0 may overlap the first and third contact structures CS1 and CS3 and may expose upper surfaces thereof.

A first etch stop layer 165 and an insulating barrier film 166 are sequentially formed on the interlayer insulating layer 161. For example, the first etch stop layer 165 may include silicon nitride, silicon carbonitride, aluminum nitride, and/or aluminum oxide. For example, the insulating barrier film 166 may include silicon oxide, silicon nitride, and/or silicon oxynitride.

In a process of forming a first hole V0 according to an exemplary embodiment of the present inventive concept, in a similar manner to a single damascene process, the first insulating layer 171 is formed, and then only a process of forming a hole for a metal via is performed. For example, the first insulating layer 171 may include a SiOC film and/or a SiCOH film. For example, the first insulating layer 171 may be formed using a deposition process such as CVD.

Figure 5A:
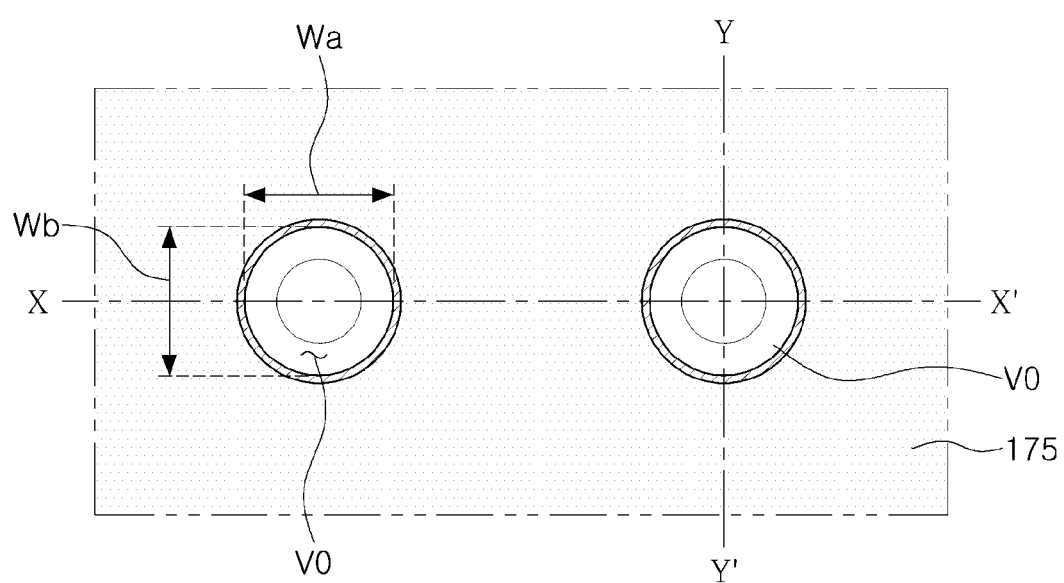
Figure 5B:
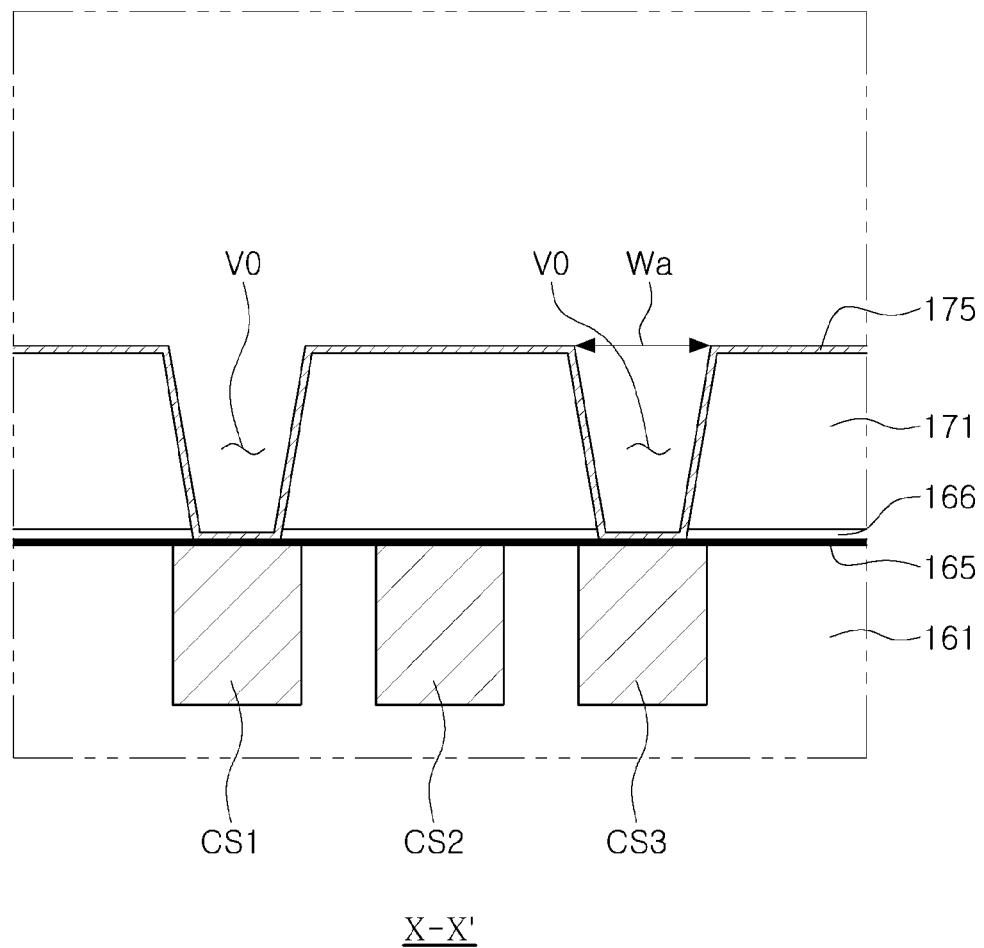
Figure 5C:
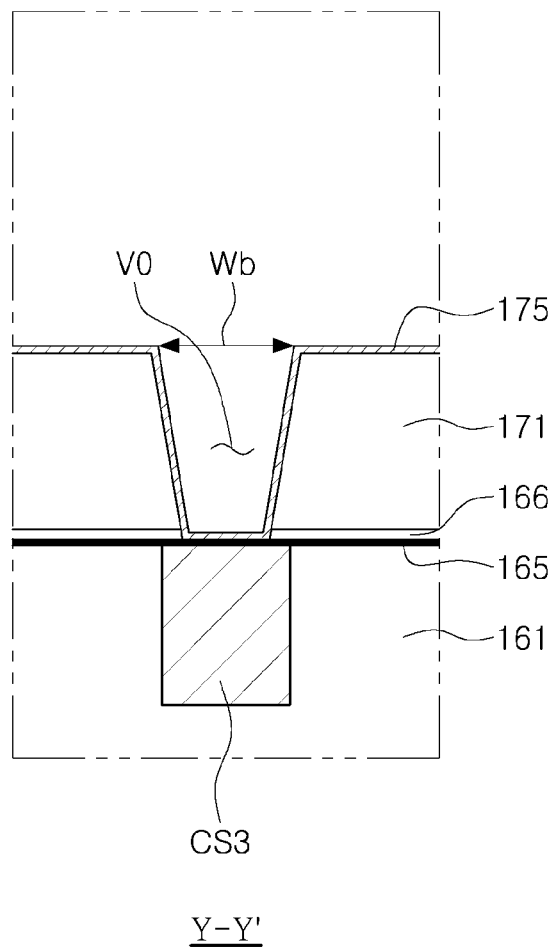

Referring to FIGS. 5A to 5C, a second etch stop layer 175 is formed on the first insulating layer 171 including the first holes V0.

The second etch stop layer 175 may be conformally formed on a surface of the first insulating layer 171 having the first holes V0. The second etch stop layer 175 may be also formed on an inner side wall of the first holes V0. The second etch stop layer 175 may include a material with high etch selectivity as compared with the first and second insulating layers 171 and 172. For example, the second etch stop layer 175 may include silicon nitride, silicon carbonitride, aluminum nitride, and/or aluminum oxide. According to an exemplary embodiment of the present inventive concept, the second etch stop layer 175 may include a material the same as that of the first etch stop layer 171. The first holes V0 may have a flat cross section which is relatively circular in a plan view (see FIG. 5A). A width Wa of the first hole V0 in the first direction (e.g., the X direction) may be similar to a width Wb in the second direction (e.g., the Y direction).

Figure 6A:
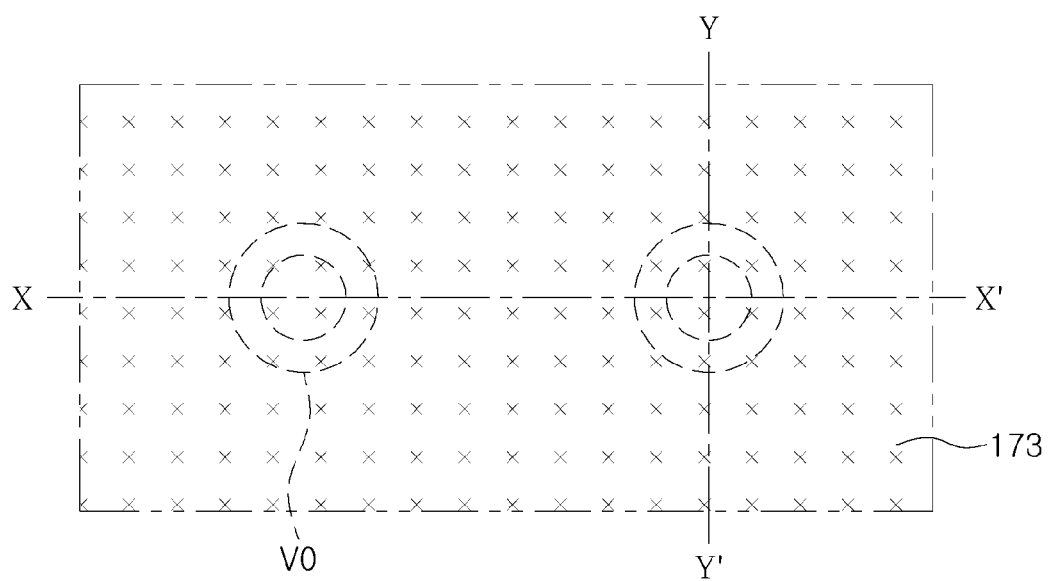
Figure 6B:
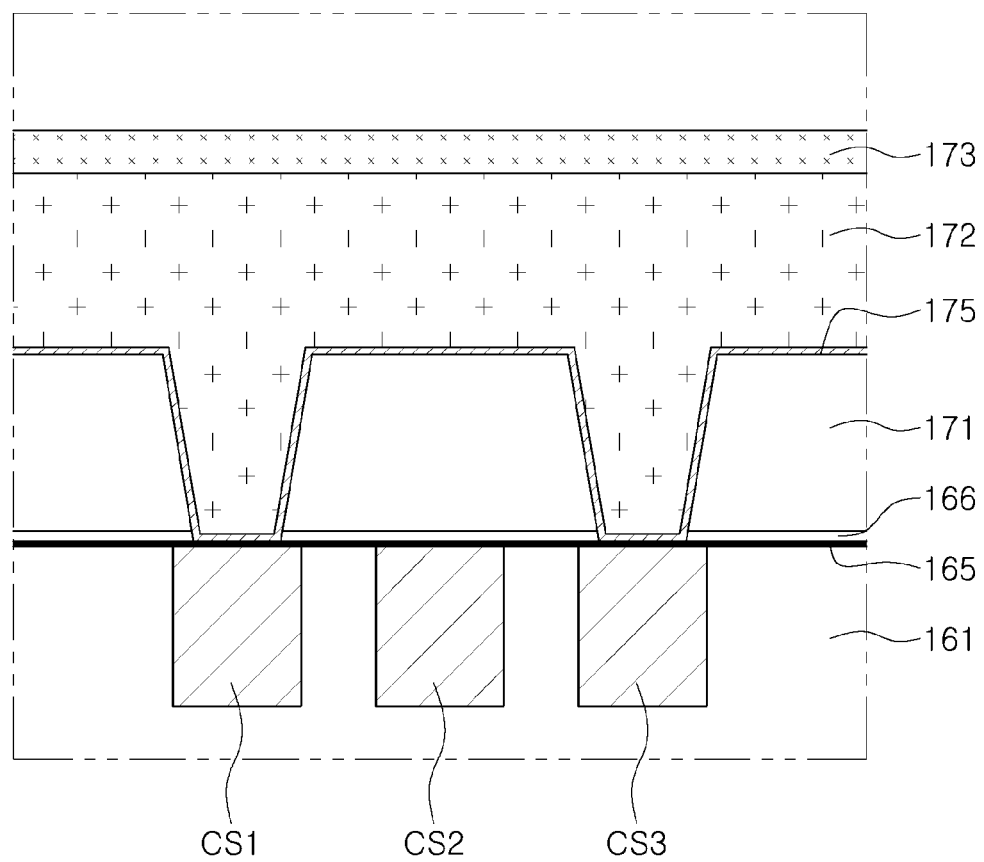
Figure 6C:
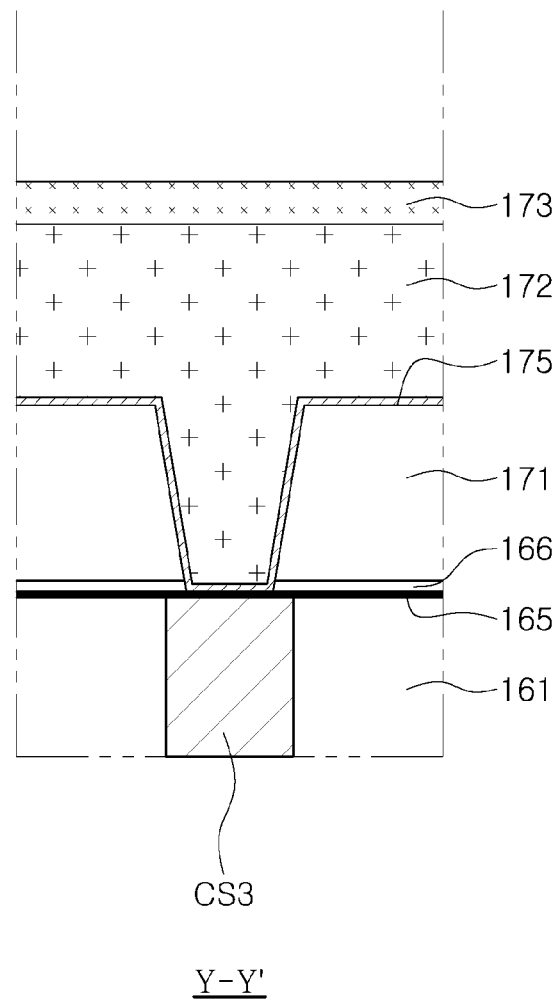

Referring to FIGS. 6A to 6C, a second insulating layer 172 is formed on the first insulating layer 171 having a second etch stop layer 175.

The second insulating layer 172 is formed on the first insulating layer 171 while the first holes V0 are filled, and may thus provide an intermetallic insulator structure together with the first insulating layer 171. The second insulating layer 172 may be formed using a spin coating or flowable CVD process. The second insulating layer 172 may include a composition different from a composition of the first insulating layer 171. For example, even when the first insulating layer 171 and the second insulating layer 172 include the same component, the composition ratios may be different from each other. For example, the first insulating layer 171 and the second insulating layer 172 include SiCOH, and may have different composition ratios. In addition, on the second insulating layer 172, a protective insulating layer 173 such as TiN may be formed.

Figure 7A:
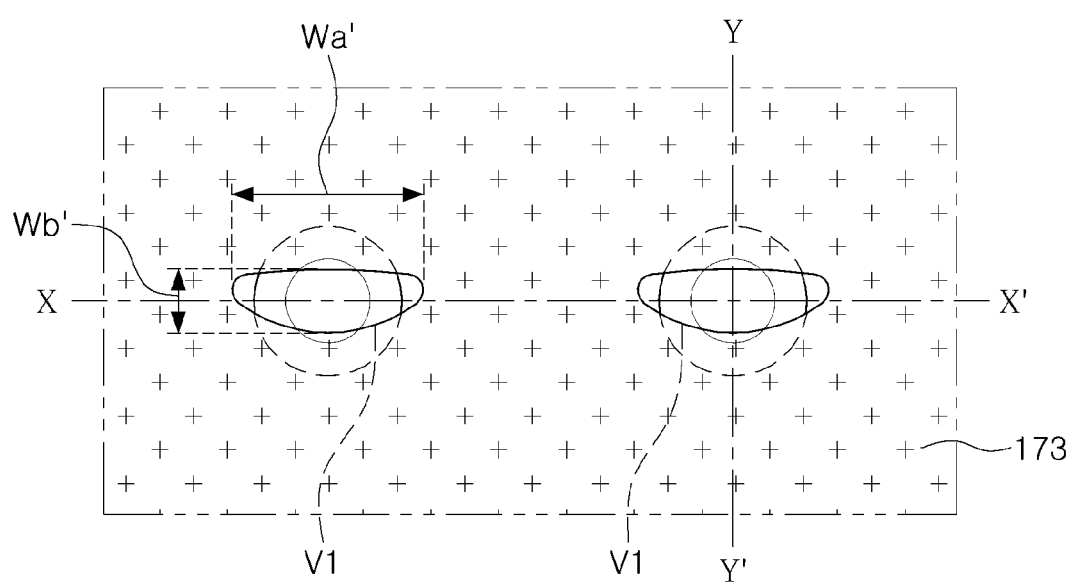
Figure 7B:
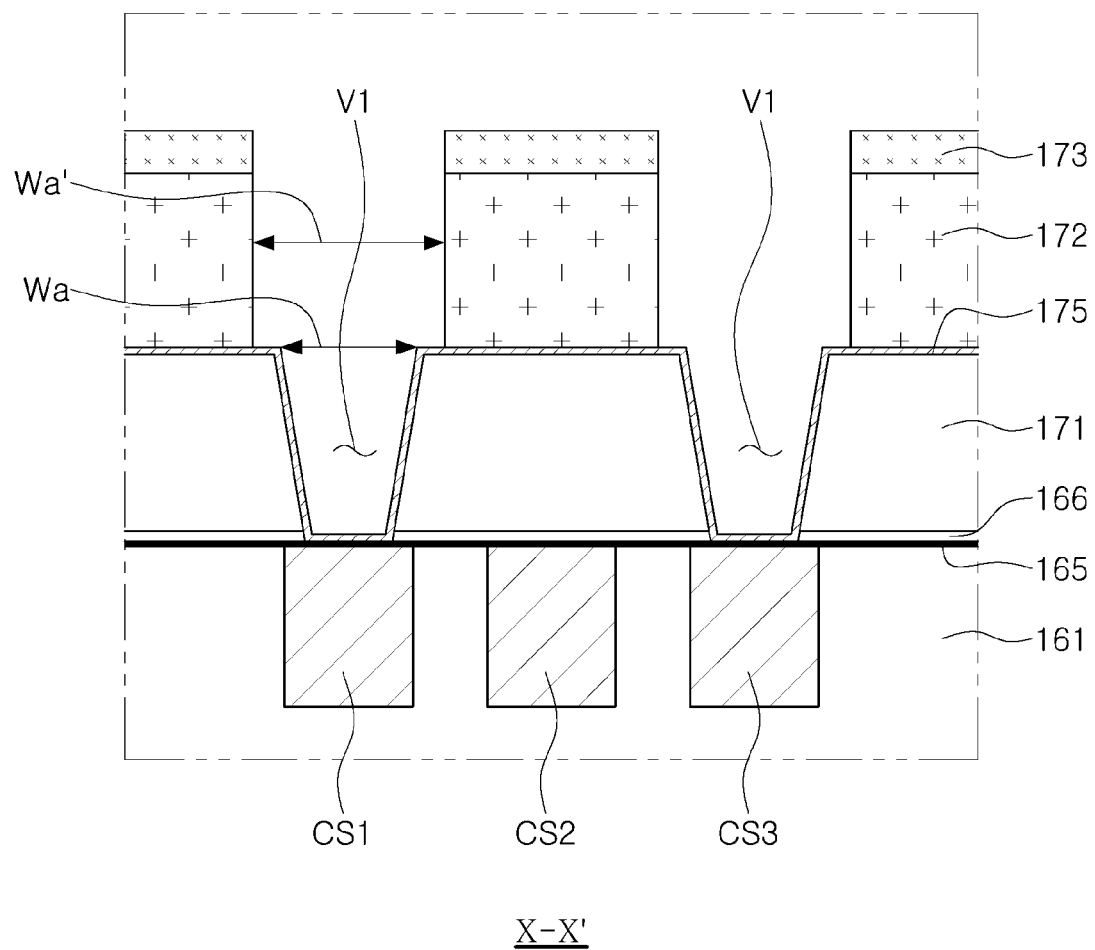
Figure 7C:
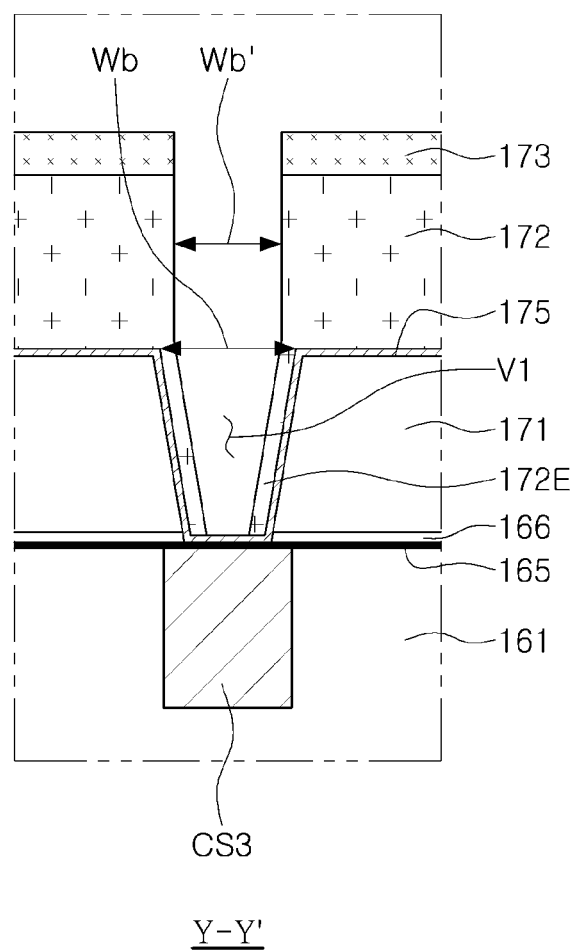

Referring to FIGS. 7A to 7C, second holes V1 connected to the first holes V0 may be formed in the second insulating layer 172.

The second insulating layer 172 may have an extended portion 172E formed partially on an inner side wall of a first hole, and the first hole V0 may be rearranged as the second hole V1 due to the extended portion 172E. The second hole V1 may have a width reduced as compared with a width of the first hole V0.

For example, as illustrated in FIG. 7B, the second hole V1 may be formed to have a width Wa' greater than a maximum width Wa of the first hole V0 in the first direction (e.g., the X direction), so a contact area of the first and third contact structures CS1 and CS3 may be maintained to have the width Wa of the first hole V0. As illustrated in FIG. 7C, the second hole V1 may be formed to have a width Wb' less than a width Wb of the first hole V0 in the second direction (e.g., the Y direction), so a contact area of the first and third contact structures CS1 and CS3 may be readjusted to have a width Wb' of the second hole V1 due to the extended portion 172E of the second insulating layer.

In a process of forming the second hole V1, a portion of the first insulating layer 171, exposed by the second hole V1, is protected by the second etch stop layer 175 and is thus not chamfered, and a side wall around the first hole V0 may be maintained substantially vertically.

Figure 8A:
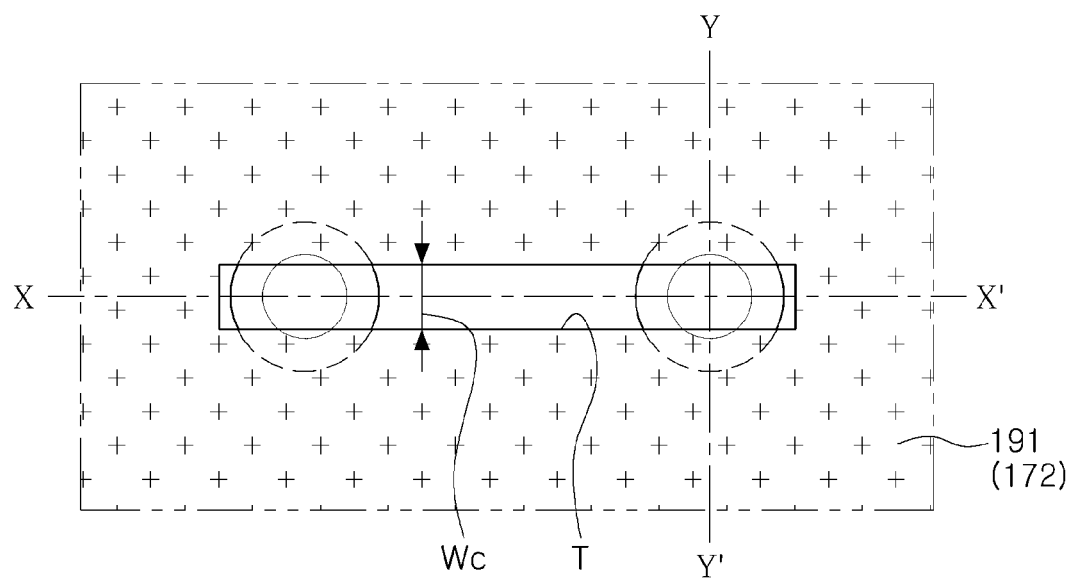
Figure 8B:
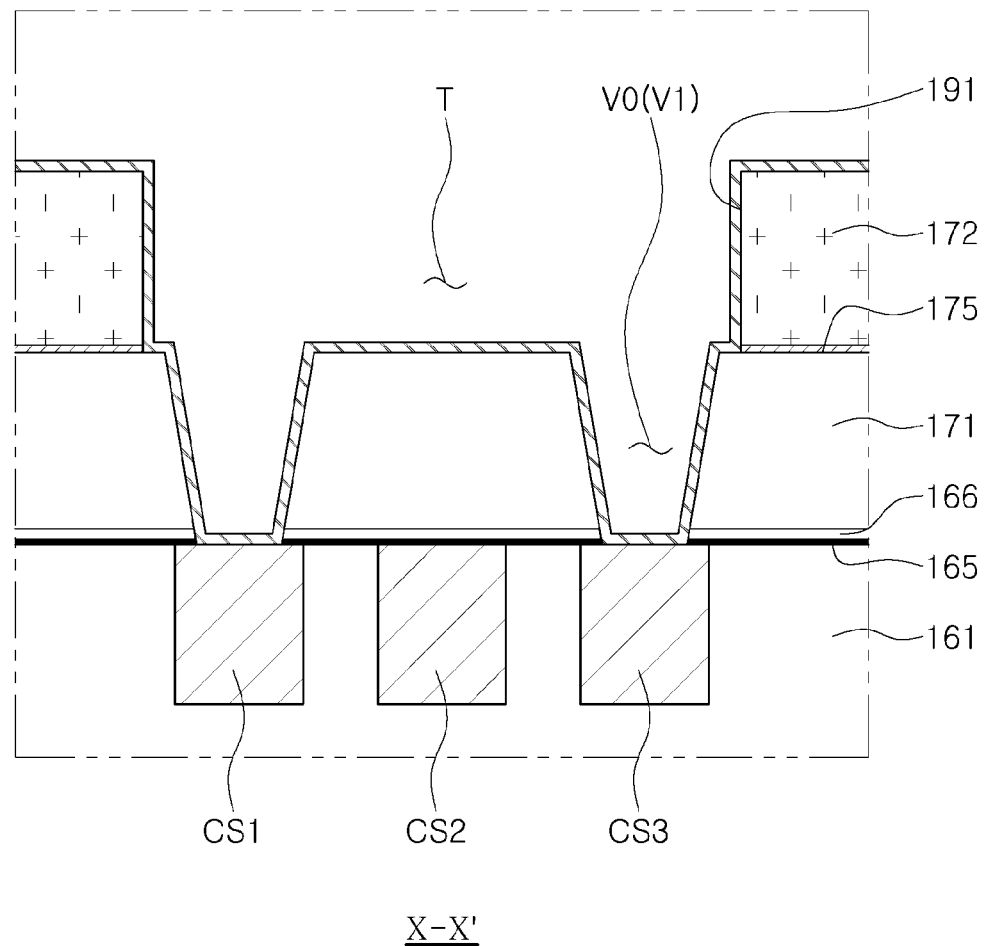
Figure 8C:
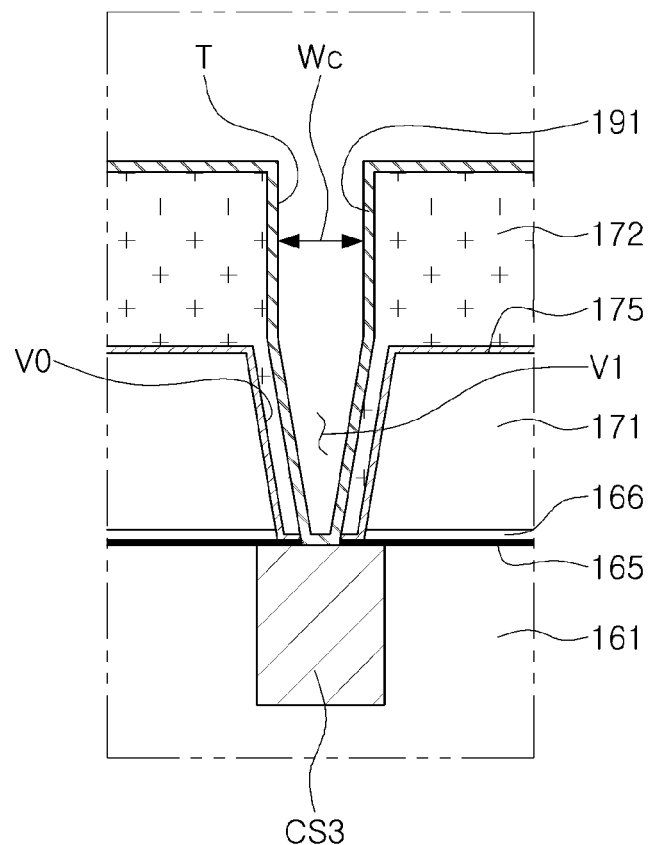

Referring to FIGS. 8A to 8C, a trench T, to which the second holes V1 are connected, is formed in the second insulating layer 172. For example, the second insulating layer 172 overlapping the second contact structure CS2 may be removed as well as the entirety of the protective insulating layer 173. A portion of the second etch stop layer 175, exposed to the trench T, is removed, and a conductive barrier 191 is formed on the exposed sidewalls of the second insulating layer 172.

The trench T is formed to connect the second holes V1, and may define a region for eventual formation of a wiring line ML. The trench T is extended in a first direction (e.g., the X direction), and may be formed to have a width Wc in the second direction (e.g., the Y direction) similar to a width Wb' of the second hole V1. In a process of forming the trench T, in a manner similar to the process of forming the second hole V, described above, an exposed portion of the first insulating layer 171 may be protected by the second etch stop layer 175.

Then, a process of removing the second etch stop layer 175 is performed. A portion of a high dielectric film is removed in a possible range, so degradation of RC performance can be reduced. In an exemplary embodiment of the present inventive concept, the second etch stop layer 175 may be removed from a region exposed by the trench T and the second holes V1 in the X-X' cross section. As a result, the second etch stop layer 175 is removed in a region in which a wiring structure 190 is to be formed, but may ultimately remain in another region, for example, a region between the first and second insulating layers 171 and 172 while not being removed therefrom. Even when a portion of the second etch stop layer 175 located between the first and second insulating layers 171 and 172 in the Y-Y' cross-section remains, it may not be adjacent to a wiring structure 190 or provided between circuits owing to the intervening extended portions 172E. Thus, an impact on RC performance may not be significant.

Then, a conductive barrier 191 for a wiring structure 190 is formed. As illustrated in FIGS. 8B and 8C, a conductive barrier 191 may be conformally formed in regions from which the second etch stop layer 175 is removed. For example, the conductive barrier 191 may be formed on surfaces of the first and second insulating layers 171 and 172 and contact regions of the first and third contact structures CS1 and CS3, exposed to the trench T and the second holes V1.

Figure 9A:
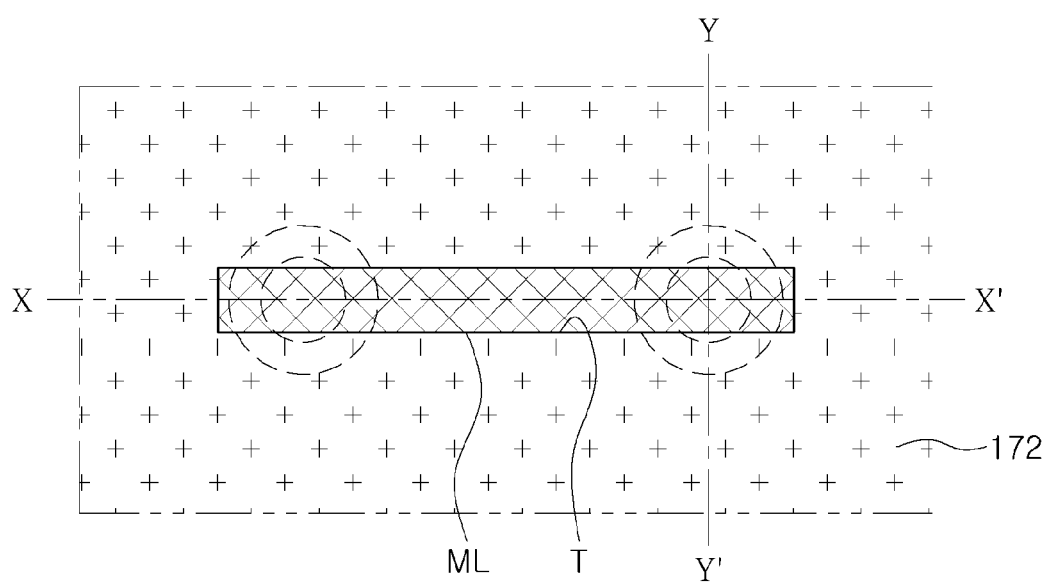
Figure 9B:
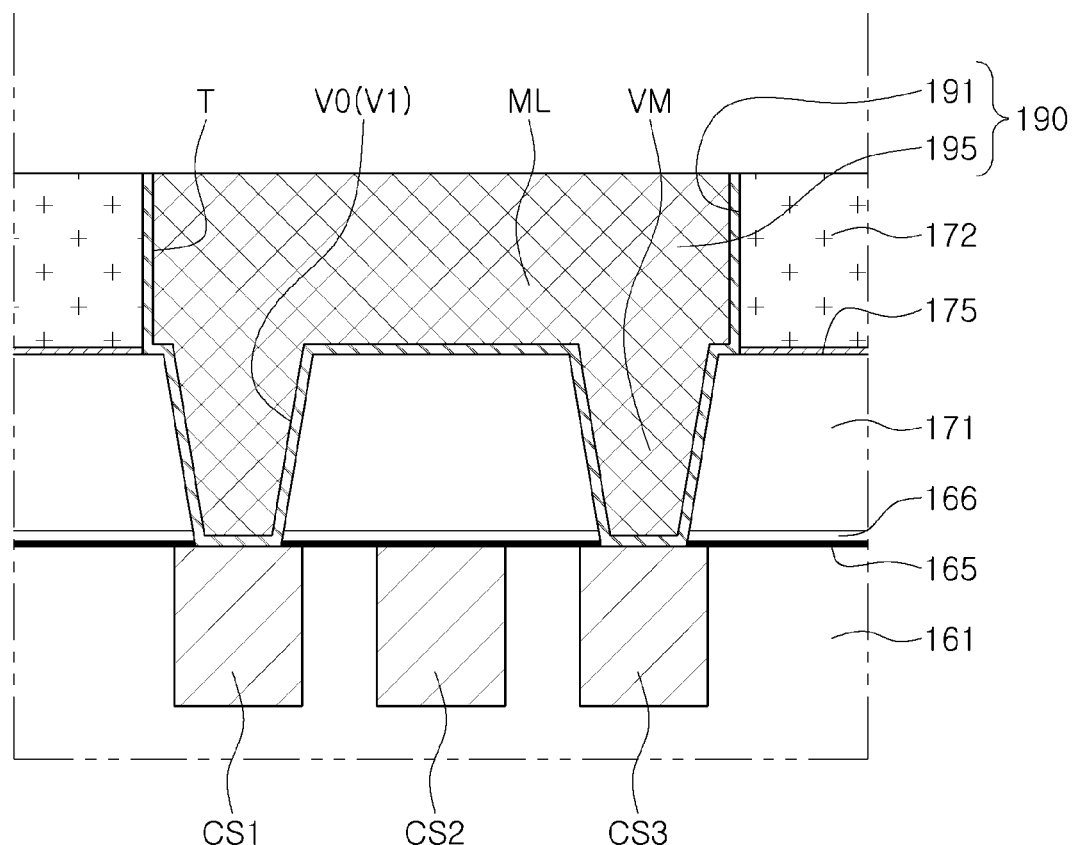
Figure 9C:
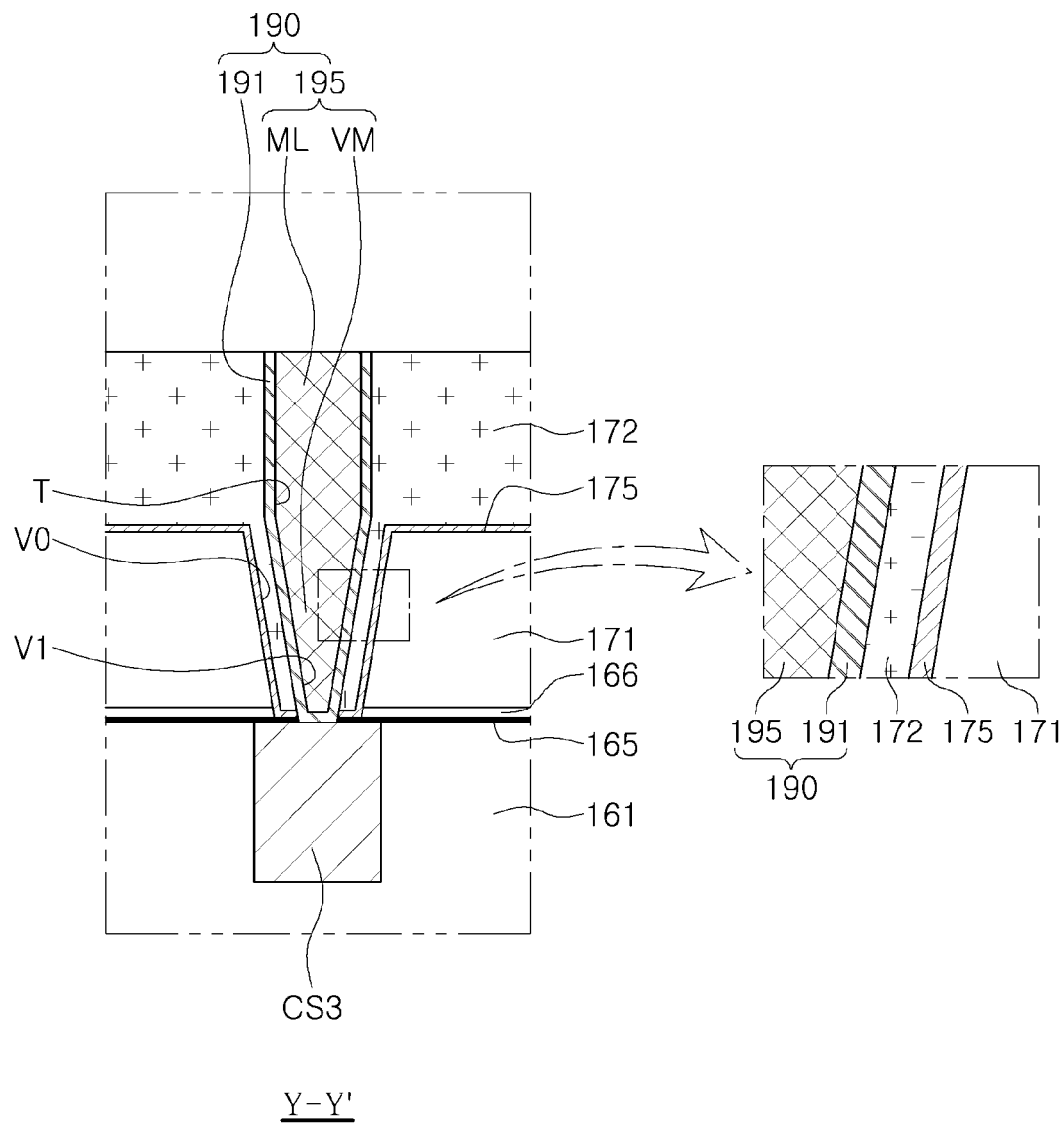

Referring to FIGS. 9A to 9C, the second holes V1 and the trench T are filled with a conductive material 195 to form the wiring structure 190.

In the previous operation, it may also be formed on an upper surface of the second insulating layer 172, and the conductive material 195 to be filled may be also located on an upper surface of the second insulating layer 172. Portions of the conductive barrier 191 and the conductive material 195, located on an upper surface of the second insulating layer 172, are formed through a planarization process to form the wiring structure 190 illustrated in FIGS. 9A and 9C. For example, the conductive material 195 may include Cu, Co, Mo, Ru, and/or W. The conductive material 195 may include a conductive via VM connected to the first and third contact structures CS1 and CS3 through the second hole V1, and a wiring line ML filling the trench T and connected to the conductive via VM.

As illustrated in FIG. 9B, when viewed in a X-X' cross-section, a second etch stop layer 175 is not provided at an interface between the wiring structure 190 and the first insulating layer 171 and at an interface between the wiring structure 190 and the second insulating layer 172. Thus, the conductive barrier 191 of the wiring structure 190 may be in direct contact with a surface of the first and second insulating layers 171 and 172. A second etch stop layer 175 may be disposed between the first and second insulating layers 171 and 172.

As illustrated in FIG. 9C, when viewed in a Y-Y' cross-section, the second etch stop layer 175 is extended and remains on an inner side wall of the first hole V0 and a portion of an insulating barrier film 166 located on a bottom surface of the first hole V0. On the other hand, the second etch stop layer 175 is not provided in a region in which the wiring structure 190 is located. In a direction of a width of the first hole V0, a conductive material 195, a conductive barrier 191, a second insulating layer 172, a second etch stop layer 175, and a first insulating layer 171 may be arranged in this order (see a partial enlarged view of FIG. 9C).

Figure 10A:
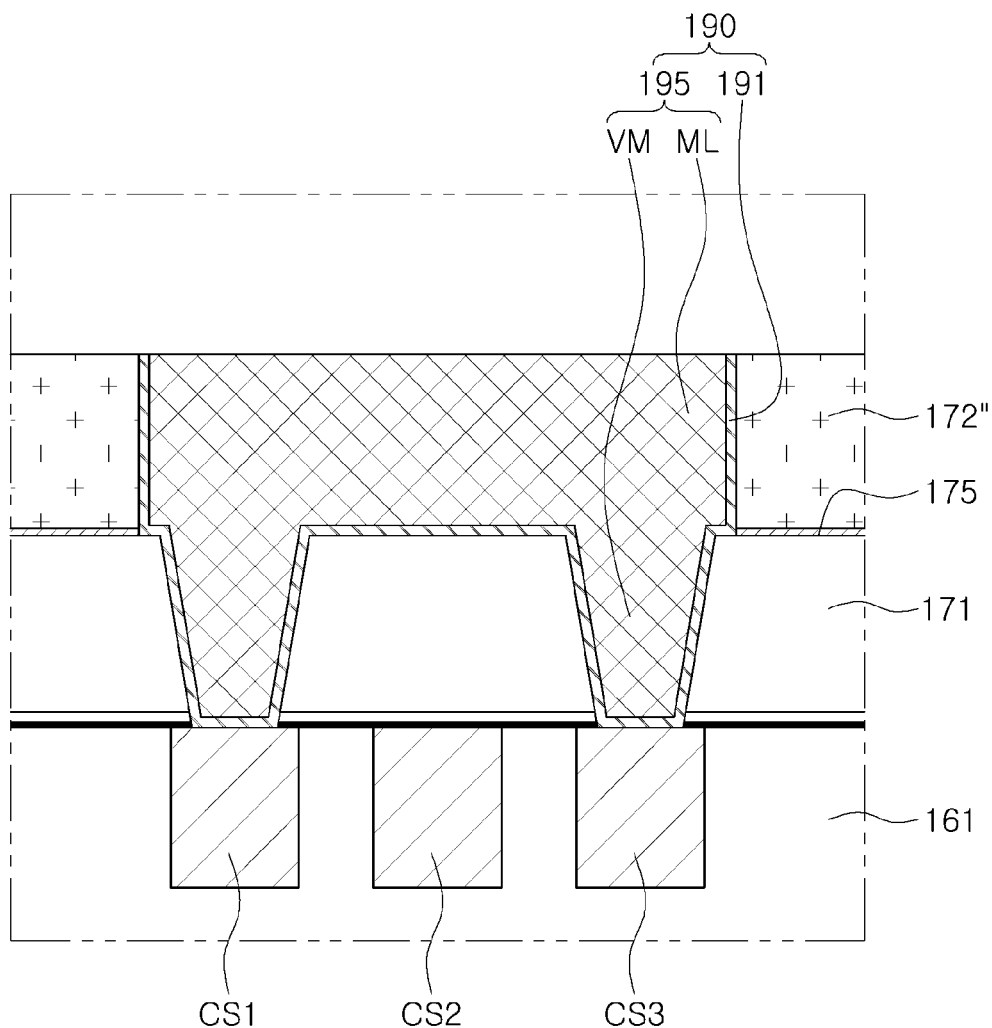
FIGS. 10A and 10B are cross-sectional views illustrating a semiconductor device according to an exemplary embodiment of the present inventive concept.
Figure 10B:
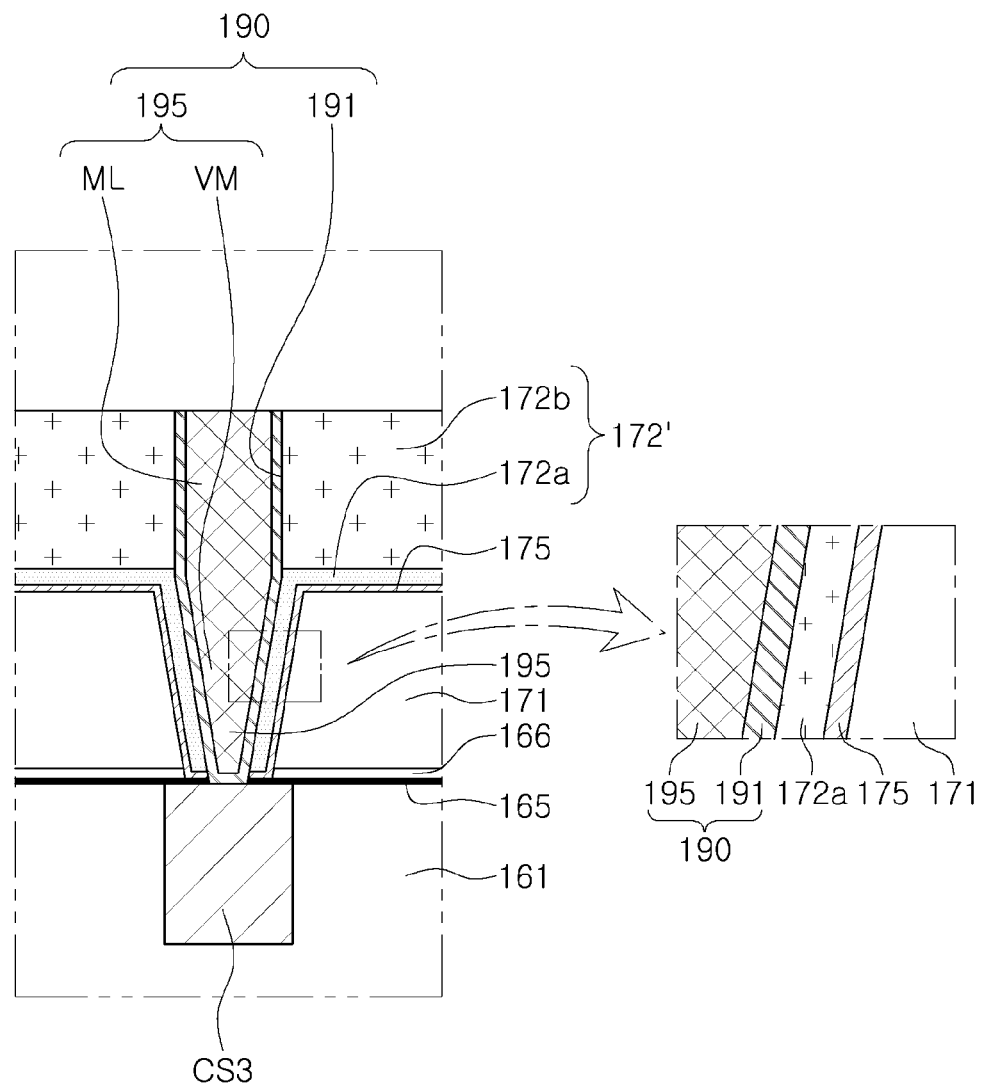

FIGS. 10A and 10B are cross-sectional views of a semiconductor device according to an exemplary embodiment of the present inventive concept, and may be cross-sections corresponding to FIGS. 9B and 9C.

Referring to FIGS. 10A and 10B, a semiconductor device according to an exemplary embodiment of the present inventive concept may be similar to the exemplary embodiment of the present inventive concept illustrated in FIGS. 9B and 9C except that the second insulating layer 172' includes a first layer 172a and a second layer 172b including different materials. Like reference numerals may refer to previously described elements.

The first insulating layer 171 may be a low dielectric film formed using a process such as CVD in a similar manner to previously described exemplary embodiments of the present inventive concept. The second insulating layer 172', employed in an exemplary embodiment of the present inventive concept, may be divided into a first layer 172a and a second layer 172b. The first layer 172a may be formed as an insulating film with excellent gap fill characteristics in a manner similar to the second insulating layer 172. For example, the first layer 172a may be formed as a spin-on glass (SOG) layer or a flowable CVD oxide layer, while the second layer 172b may be formed using a deposition process such as CVD in a similar manner to the first insulating layer 171. As described above, it is not necessary that the second insulating layer 172' be formed of a different material and/or using a different process from that of the first insulating layer 171 as a whole. According to an exemplary embodiment of the present inventive concept, a material of the first layer 172a' having excellent gap fill characteristics may be used only in a portion in which a first hole V0 is filled.

In a similar manner to previously described exemplary embodiments of the present inventive concept, when viewed in the Y-Y' cross-section, in a direction of a width of the first hole V0, a conductive material 195, a conductive barrier 191, a second insulating layer 172a of a second insulating layer 172', a second etch stop layer 175, and a first insulating layer 171 may be arranged in this order (see a partial enlarged view of FIG. 10B).

Figure 11A:
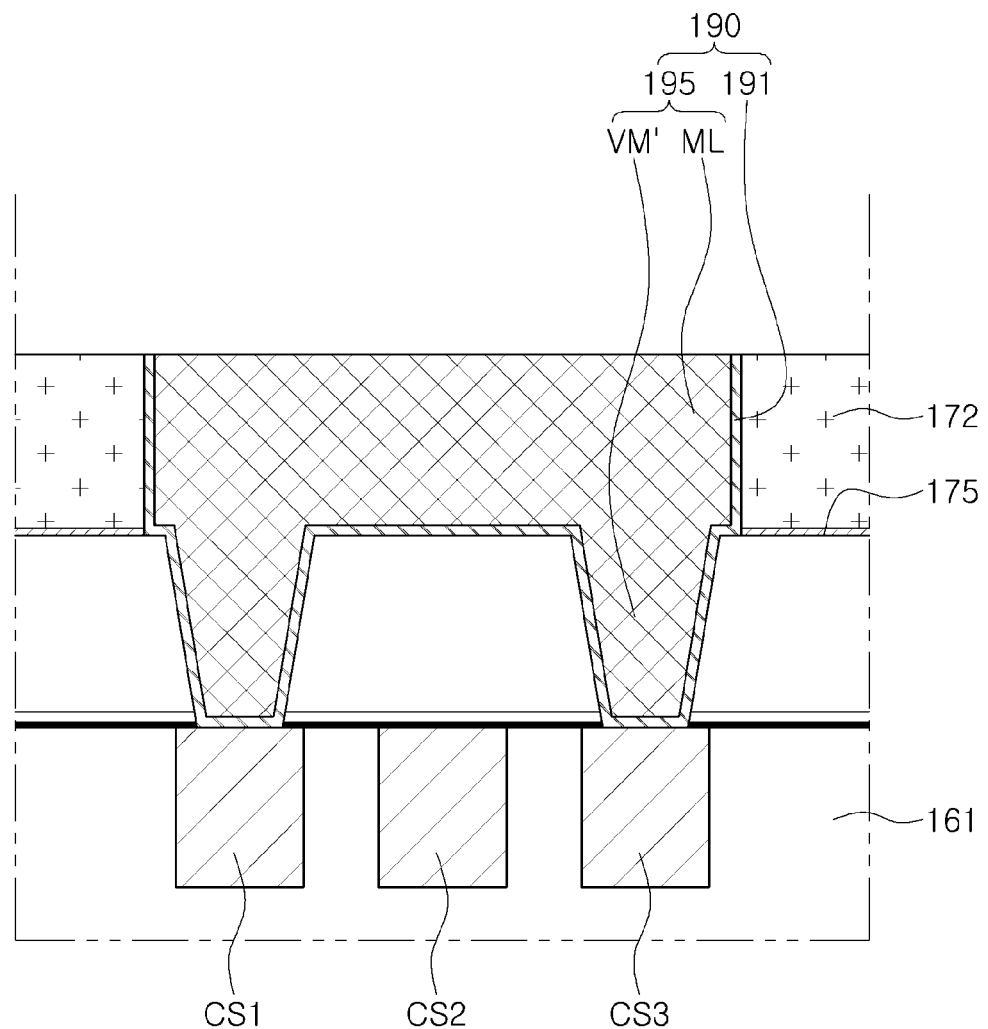
FIGS. 11A and 11B are cross-sectional views illustrating a semiconductor device according to an exemplary embodiment of the present inventive concept.
Figure 11B:
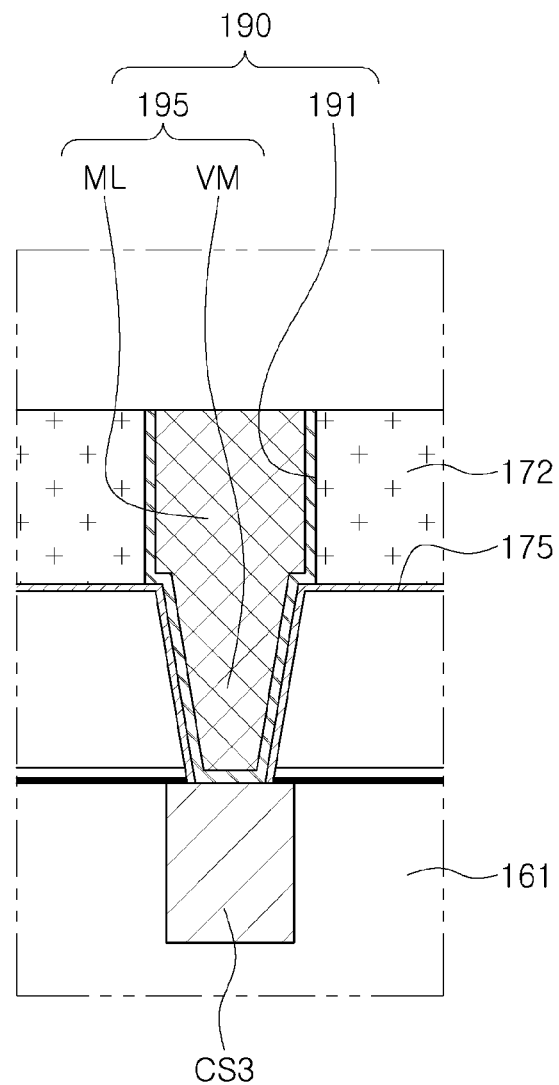

FIGS. 11A and 11B are cross-sectional views of a semiconductor device according to an exemplary embodiment of the present inventive concept.

Referring to FIGS. 11A and 11B, a semiconductor device according to an exemplary embodiment of the present inventive concept may be similar to an exemplary embodiment of the present inventive concept illustrated in FIGS. 9B and 9C, except that a hole of the first insulating layer 171 is not redefined using a second insulating layer 172. Like reference numerals may refer to elements previously described.

In a first direction (e.g., the X direction) and a second direction (e.g., the Y direction), a contact area of a conductive via VM and a third contact structure CS3 may be defined by a hole of the first insulating layer 171. For example, in an exemplary embodiment of the present inventive concept, both a width of a trench T hole of the second insulating layer 172 in a first direction (e.g., the X direction) and a width in a second direction (e.g., the Y direction) may be set to be greater than a width of the second hole V1 of the first insulating layer 171. As a result, a contact area may be determined by a hole of the first insulating layer 171, in a manner different from previous exemplary embodiments of the present inventive concept.

The second etch stop layer 175, employed in an exemplary embodiment of the present inventive concept, might only be disposed between the first and second insulating layers 171 and 172 in a manner similar to a previously described exemplary embodiment of the present inventive concept. For example, as illustrated in FIGS. 11A and 11B, the second etch stop layer 175 is not provided in a region in direct contact with the wiring structure 190, and a conductive barrier 191 of the wiring structure 190 is in direct contact with the first and second insulating layers 171 and 172. Moreover, due to the second etch stop layer 175, a portion of the first insulating layer 171, located between conductive vias VM, is not chamfered, and an inner side wall thereof may be maintained substantially vertically.

According to the exemplary embodiment of the present inventive concept described above, a wiring structure 190 on a first level connecting contact structures is mainly described, but a wiring structure on a second level may be applied in the same manner. As described above, a conductive element, connected by a wiring structure, may include a wiring structure 190 located at a low level in a BEOL structure, in addition to first to third contact structures CS1 to CS3 connected to an active region AR.

As set forth above, according to an exemplary embodiment of the present inventive concept, collapsing and/or short with contact, of an insulating layer located in a lower portion of a wiring line occurring by reducing a pitch of a metal wiring may be prevented. Moreover, the use of a high dielectric film is significantly reduced, so degradation of RC performance may be reduced.

While example embodiments of the present inventive concept have been shown and described above, it will be apparent to those of ordinary skill in the art that modifications and variations could be made without departing from the spirit and scope of the present inventive concept.

What is claimed is:

1. A semiconductor device, comprising:
   a substrate having an active region;
   an interlayer insulating layer disposed on the active region;
   a contact structure connected to the active region and passing through the interlayer insulating layer;
   a barrier dielectric layer disposed on the interlayer insulating layer;
   a first insulating layer disposed on the barrier dielectric layer, the first insulating layer having a first hole connected to the contact structure;
   a second insulating layer disposed on the first insulating layer, the second insulating layer having a trench connected to the first hole, wherein the second insulating layer has an extended portion along an inner side wall of the first hole, and wherein a width of the first hole less the space occupied by the extended portion is defined as a second hole;
   a wiring structure connected to the contact structure through the second hole, the wiring structure having a conductive material filling the second hole and the trench, and a conductive barrier disposed between the conductive material and the first and second insulating layers; and
   an etch stop layer disposed between the first and second insulating layers and between the extended portion of the second insulating layer and an inner side wall of the first hole.

2. The semiconductor device of claim 1, wherein the etch stop layer is not provided at an interface between the wiring structure and the first and second insulating layers, and a conductive barrier of the wiring structure is in contact with the first and second insulating layers.

3. The semiconductor device of claim 1, wherein the first insulating layer includes a material different from a material of the second insulating layer.

4. The semiconductor device of claim 1, wherein the second insulating layer includes a first layer including the extended portion and disposed on the first insulating layer, and a second layer disposed on the first layer and including a material different from a material of the first layer.

5. The semiconductor device of claim 4, wherein the first insulating layer includes a material the same as a material of the second layer of the second insulating layer.

6. The semiconductor device of claim 1, wherein the trench is extended in a first direction parallel to an upper surface of the substrate, and the extended portion of the second insulating layer is disposed on inner side wall portions of the first hole, the inner side walls portions spaced in a second direction, the second direction intersecting the first direction.

7. The semiconductor device of claim 6, wherein the second hole has a width in the second direction less than a width in the first direction.

8. The semiconductor device of claim 7, wherein a width of the second hole in the first direction is defined by a width of the first hole, and a width of the second hole in the second direction is defined by the extended portion of the second insulating layer.

9. The semiconductor device of claim 1, wherein the barrier dielectric layer includes an etch stop layer disposed on the interlayer insulating layer, and an insulating barrier film disposed on the etch stop layer.

10. A semiconductor device, comprising:
    a substrate having a conductive element and an interlayer insulating layer surrounding the conductive element;
    a first etch stop layer and an insulating barrier film sequentially disposed on the interlayer insulating layer;
    a first insulating layer disposed on the interlayer insulating layer, the first insulating layer having a hole connected to the conductive element;
    a second insulating layer disposed on the first insulating layer, the second insulating layer having a trench connected to the hole, the trench extending in a first direction and having an extended portion along an inner side wall of the hole in a cross-section taken along a second direction intersecting the first direction;
    a wiring structure having a conductive via connected to the conductive element through the hole, a wiring line filling the trench and connected to the conductive via, and a conductive barrier disposed between the conductive via and the wiring line and the first and second insulating layers; and
    a second etch stop layer disposed between the first and second insulating layers and extended between the extended portion and an inner side wall of the hole, the second etch stop layer not provided at an interface between the wiring structure and the first and second insulating layers.

11. The semiconductor device of claim 10, wherein, in the second direction, a width of the wiring line is less than a width of the hole.

12. The semiconductor device of claim 10, wherein, the conductive barrier, the extended portion of the second insulating layer, and the second etch stop layer are disposed between a side surface of the conductive via and the inner side wall of the hole, in a cross section through the conductive via in the second direction.

13. The semiconductor device of claim 10, wherein the conductive element includes an additional wiring structure or a contact structure.

14. The semiconductor device of claim 10, wherein the first and second etch stop layers include silicon nitride, silicon carbonitride, aluminum nitride, and/or aluminum oxide.

15. The semiconductor device of claim 14, wherein the first etch stop layer and the second etch stop layer are formed of the same material.

16. The semiconductor device of claim 10, wherein the insulating barrier film includes silicon oxide, silicon nitride, and/or silicon oxynitride.

17. The semiconductor device of claim 10, wherein the conductive via and the wiring line include Cu, Co, Mo, Ru, and/or W.

18. The semiconductor device of claim 10, wherein the conductive barrier includes Ta, TaN, Mn, MnN, WN, Ti, and TiN.

19. A semiconductor device, comprising:
a wiring structure connected to a contact structure, wherein the wiring structure comprises a metal line and a conductive via;
the metal line disposed in a first insulating layer, the metal line extending in a first direction;
the conductive via disposed in a second insulating layer, the conductive via extending in a thickness direction through the second insulating layer; and
an etch stop layer disposed between the first insulating layer and the second insulating layer,
wherein a width of the conductive via in the first direction is greater than a width of the conductive via in a second direction perpendicular to the first direction,
wherein sidewalls of the conductive via spaced in the second direction are surrounded by extending portions of the first insulating layer and the etch stop layer, the extending portions of the first insulating layer and the etch stop layer extend in an oblique direction to the thickness direction, and
wherein sidewalls of the conductive via spaced in the first direction are not covered by the extending portions of the first insulating layer and the etch stop layer.

20. The semiconductor device of claim 19, wherein the etch stop layer is not provided at an interface between the wiring structure and the first and second insulating layers, and a conductive barrier of the wiring structure is in contact with the first and second insulating layers.

\* \* \* \* \*